(12) United States Patent
Chang

(10) Patent No.: US 10,421,411 B2
(45) Date of Patent: *Sep. 24, 2019

(54) HEADREST-MOUNTED MONITOR

(71) Applicant: VOXX INTERNATIONAL CORPORATION, Hauppauge, NY (US)

(72) Inventor: Chung L. Chang, Diamond Bar, CA (US)

(73) Assignee: VOXX INTERNATIONAL CORPORATION, Hauppauge, NY (US)

( * ) Notice: Subject to any disclaimer, the term of this patent is extended or adjusted under 35 U.S.C. 154(b) by 358 days.

This patent is subject to a terminal disclaimer.

(21) Appl. No.: 15/155,128

(22) Filed: May 16, 2016

(65) Prior Publication Data

US 2016/0257262 A1 Sep. 8, 2016

Related U.S. Application Data

(63) Continuation of application No. 14/079,426, filed on Nov. 13, 2013, now Pat. No. 9,340,133, which is a (Continued)

(51) Int. Cl.
*B60R 11/02* (2006.01)
*H04N 5/64* (2006.01)
(Continued)

(52) U.S. Cl.
CPC .......... *B60R 11/0229* (2013.01); *B60N 2/879* (2018.02); *B60R 11/0217* (2013.01);
(Continued)

(58) Field of Classification Search
CPC .................................................. B60R 11/0258
See application file for complete search history.

(56) References Cited

U.S. PATENT DOCUMENTS 3,019,050 A 1/1962 Spielman
3,284,041 A 11/1966 Tjaden
(Continued)

FOREIGN PATENT DOCUMENTS

CN 2506484 8/2002
DE 3316818 11/1984
(Continued)

OTHER PUBLICATIONS

Claim Construction Order, U.S. District Court, Central District of California, *Johnson Safety, Inc.* (Plaintiff) v. *Voxx International Corporation; Voxx Electronics Corporation; and Invision Automotive Systems Inc.* (Defendants), Case No. 5: 14-cv-02591-ODW(DTB), Nov. 16, 2016, 36 pgs.
(Continued)

*Primary Examiner* — Rowina J Cattungal
(74) *Attorney, Agent, or Firm* — F. Chau & Associates, LLC

(57) ABSTRACT

A monitor adapted for mounting in an automobile headrest is provided. A screen structure of the monitor is pivotable about an upper edge thereof, such that the monitor occupies little volume within the headrest. A viewing angle of the screen structure is independently adjustable by a viewer, such that the viewer can continuously select the optimum viewing angle with changing conditions inside the automobile. The screen structure automatically retracts into a housing when struck. Thus, the monitor poses little risk of injury to passengers. The housing of the monitor is attachable to the headrest with screws, which provides a very sturdy connection and reduces the chances of the housing becoming detached from the headrest during a vehicle collision. The hinged connection between the screen structure and the housing is preferably constructed of interconnected components made from sturdy materials, such as metals. Hinge (Continued)

components are optionally secured with metal fastening members and fastening apertures made of metal and strong plastics. The hinges are thus unlikely to break during a vehicle collision.

10 Claims, 11 Drawing Sheets

Related U.S. Application Data continuation of application No. 12/475,332, filed on May 29, 2009, now Pat. No. 8,585,140, which is a continuation of application No. 11/777,936, filed on Jul. 13, 2007, now abandoned, which is a continuation of application No. 11/401,475, filed on Apr. 10, 2006, now Pat. No. 7,267,402, which is a continuation of application No. 10/762,630, filed on Jan. 20, 2004, now Pat. No. 7,044,546, which is a continuation-in-part of application No. 10/219,987, filed on Aug. 14, 2002, now Pat. No. 7,036,879.

(51) Int. Cl.
*H05K 5/00* (2006.01)
*H05K 5/02* (2006.01)
*B60N 2/879* (2018.01)
*B60R 11/00* (2006.01)

(52) U.S. Cl.
CPC ...... *B60R 11/0235* (2013.01); *B60R 11/0247* (2013.01); *H04N 5/64* (2013.01); *H05K 5/0017* (2013.01); *H05K 5/0226* (2013.01); *B60R 2011/0017* (2013.01); *B60R 2011/0075* (2013.01); *B60R 2011/0082* (2013.01); *B60R 2011/0085* (2013.01); *B60R 2011/0276* (2013.01); *Y10T 29/49947* (2015.01)

(56) References Cited

U.S. PATENT DOCUMENTS

| | | |
|---|---|---|
| 3,737,184 A | 6/1973 | Swartz |
| 3,773,378 A | 11/1973 | Lewis |
| 3,944,020 A | 3/1976 | Brown |
| D246,037 S | 10/1977 | Kelly |
| D247,234 S | 2/1978 | Stewart |
| 4,079,987 A | 3/1978 | Bumgardener |
| 4,100,372 A | 7/1978 | Hypolite |
| 4,101,159 A | 7/1978 | Stewart |
| 4,241,870 A | 12/1980 | Marcus |
| 4,281,577 A | 8/1981 | Middleton |
| D260,507 S | 9/1981 | Kosugi et al. |
| D264,969 S | 6/1982 | McGourty |
| 4,352,200 A | 9/1982 | Oxman |
| 4,394,055 A | 7/1983 | Smith |
| 4,440,443 A | 4/1984 | Nordskog |
| 4,445,750 A | 5/1984 | Grois et al. |
| D280,312 S | 8/1985 | Simeri et al. |
| D282,251 S | 1/1986 | Isham et al. |
| D282,733 S | 2/1986 | Giavazzi et al. |
| 4,584,603 A | 4/1986 | Harrison |
| D284,280 S | 6/1986 | Mack, Jr. et al. |
| D285,684 S | 9/1986 | Akita et al. |
| 4,630,821 A | 12/1986 | Greenwald |
| 4,635,110 A | 1/1987 | Weinblatt |
| 4,643,606 A | 2/1987 | House |
| 4,647,980 A | 3/1987 | Steventon et al. |
| 4,669,694 A | 6/1987 | Malick |
| 4,681,366 A | 7/1987 | Lobanoff |
| 4,702,519 A | 10/1987 | Lobanoff |
| 4,756,528 A | 7/1988 | Umashankar |
| 4,758,047 A | 7/1988 | Hennington |
| 4,774,514 A | 9/1988 | Hildebrandt et al. |
| 4,792,183 A | 12/1988 | Townsend, III |
| 4,797,934 A | 1/1989 | Hufnagel |
| 4,818,010 A | 4/1989 | Dillon |
| 4,824,159 A | 4/1989 | Fluharty et al. |
| 4,833,727 A | 5/1989 | Calvet et al. |
| 4,843,477 A | 6/1989 | Mizutani et al. |
| 4,866,515 A | 9/1989 | Tagawa et al. |
| 4,867,498 A | 9/1989 | Delphia et al. |
| 4,870,676 A | 9/1989 | Lewo |
| 4,950,842 A | 8/1990 | Menninga |
| RE33,423 E | 11/1990 | Labanoff |
| 4,982,996 A | 1/1991 | Vottero-Fin et al. |
| 4,983,951 A | 1/1991 | Igarashi et al. |
| 5,040,990 A | 8/1991 | Suman et al. |
| D320,587 S | 10/1991 | Kapp et al. |
| 5,061,996 A | 10/1991 | Schiffman |
| D323,929 S | 2/1992 | Hodson |
| 5,096,271 A | 3/1992 | Portman |
| 5,109,572 A | 5/1992 | Park |
| 5,145,128 A | 9/1992 | Umeda |
| 5,163,870 A | 11/1992 | Cooper |
| 5,177,616 A | 1/1993 | Riday |
| 5,188,421 A | 2/1993 | Arseneault |
| 5,214,514 A | 5/1993 | Haberkem |
| D338,003 S | 8/1993 | Nakayama |
| D340,016 S | 10/1993 | Falcoff |
| 5,255,214 A | 10/1993 | Ma |
| 5,267,337 A | 11/1993 | Kirma |
| 5,267,775 A * | 12/1993 | Nguyen ............... B60R 11/0235 297/217.3 |
| 5,303,970 A | 4/1994 | Young et al. |
| 5,311,302 A | 5/1994 | Berry et al. |
| D349,893 S | 8/1994 | Bennett |
| 5,338,081 A | 8/1994 | Young et al. |
| 5,359,349 A | 10/1994 | Jambor et al. |
| 5,396,340 A | 3/1995 | Ishii et al. |
| 5,397,160 A | 3/1995 | Landry |
| 5,410,447 A | 4/1995 | Miyagawa et al. |
| 5,467,106 A | 11/1995 | Salomon |
| 5,469,298 A | 11/1995 | Suman et al. |
| 5,507,556 A | 4/1996 | Dixon |
| 5,522,638 A | 6/1996 | Falcoff et al. |
| 5,529,265 A | 6/1996 | Sakurai |
| D371,357 S | 7/1996 | Nakamura |
| 5,547,248 A | 8/1996 | Marechal |
| 5,555,466 A | 9/1996 | Scribner et al. |
| 5,583,735 A | 12/1996 | Pease et al. |
| 5,610,822 A | 3/1997 | Murphy |
| 5,636,891 A | 6/1997 | Van Order et al. |
| D385,857 S | 11/1997 | Cohen et al. |
| 5,696,861 A | 12/1997 | Schimmeyer |
| D389,818 S | 1/1998 | Smith |
| 5,705,860 A | 1/1998 | Ninh et al. |
| 5,709,360 A | 1/1998 | Rosen |
| D390,219 S | 2/1998 | Rosen |
| 5,713,633 A | 2/1998 | Lu |
| D394,432 S | 5/1998 | Rosen |
| 5,775,762 A | 7/1998 | Vitito |
| 5,808,660 A | 9/1998 | Sekine et al. |
| 5,808,862 A | 9/1998 | Robbins |
| 5,811,791 A | 9/1998 | Portman |
| D399,200 S | 10/1998 | Rosen |
| 5,822,023 A | 10/1998 | Suman et al. |
| 5,823,599 A | 10/1998 | Gray |
| 5,831,811 A | 11/1998 | Van Horn |
| 5,842,715 A | 12/1998 | Jones |
| 5,847,685 A | 12/1998 | Otsuki |
| D410,458 S | 6/1999 | Rosen |
| D410,464 S | 6/1999 | Hakoda |
| 5,910,882 A | 6/1999 | Burrell |
| 5,927,784 A | 7/1999 | Vitito |
| 5,930,376 A | 7/1999 | Markow et al. |
| 5,940,120 A | 8/1999 | Frankhouse et al. |
| 5,946,055 A | 8/1999 | Rosen |
| D413,856 S | 9/1999 | Scribner |
| D413,937 S | 9/1999 | Smith |
| 5,949,345 A | 9/1999 | Beckert et al. |
| 5,959,596 A | 9/1999 | McCarten et al. |
| D414,856 S | 10/1999 | Zuege |

(56) References Cited

U.S. PATENT DOCUMENTS

| | | |
|---|---|---|
| D416,015 S | 11/1999 | Mitchell |
| 5,982,429 A | 11/1999 | Kamamoto et al. |
| 5,984,347 A | 11/1999 | Blanc-Rosset |
| 5,996,954 A | 12/1999 | Rosen et al. |
| 5,997,091 A | 12/1999 | Rech et al. |
| 6,007,036 A | 12/1999 | Rosen |
| 6,045,181 A | 4/2000 | Ikeda et al. |
| 6,055,478 A | 4/2000 | Heron |
| 6,056,248 A | 5/2000 | Ma |
| 6,056,364 A | 5/2000 | De Filippo |
| 6,059,255 A | 5/2000 | Rosen et al. |
| 6,081,420 A | 6/2000 | Kim et al. |
| 6,092,705 A | 7/2000 | Meritt |
| 6,093,039 A | 7/2000 | Lord |
| 6,097,448 A | 8/2000 | Perkins |
| 6,102,476 A | 8/2000 | May et al. |
| 6,115,086 A | 9/2000 | Rosen |
| 6,124,902 A | 9/2000 | Rosen |
| 6,125,030 A | 9/2000 | Mola et al. |
| D432,586 S | 10/2000 | Galli-Zugaro et al. |
| 6,135,801 A | 10/2000 | Helot et al. |
| D434,400 S | 11/2000 | Rosen |
| D434,749 S | 12/2000 | Ito et al. |
| 6,157,418 A | 12/2000 | Rosen |
| 6,177,887 B1 | 1/2001 | Jerome |
| 6,179,263 B1 | 1/2001 | Rosen et al. |
| 6,181,387 B1 | 1/2001 | Rosen |
| D437,837 S | 2/2001 | Harrison et al. |
| 6,186,459 B1 | 2/2001 | Ma |
| 6,195,438 B1 | 2/2001 | Yumoto et al. |
| D438,853 S | 3/2001 | Iino |
| 6,199,810 B1 * | 3/2001 | Wu .............. B60R 11/0235 248/291.1 |
| 6,216,927 B1 | 4/2001 | Meritt |
| 6,219,927 B1 | 4/2001 | Westermaier |
| 6,231,371 B1 | 5/2001 | Helot |
| 6,246,449 B1 | 6/2001 | Rosen |
| 6,250,967 B1 | 6/2001 | Chu |
| 6,256,837 B1 | 7/2001 | Lan et al. |
| 6,266,236 B1 | 7/2001 | Ku et al. |
| 6,267,428 B1 | 7/2001 | Baldas et al. |
| D446,507 S | 8/2001 | Rosen et al. |
| D446,519 S | 8/2001 | Wu |
| 6,275,376 B1 | 8/2001 | Moon |
| D448,009 S | 9/2001 | Lavelle et al. |
| 6,292,236 B1 | 9/2001 | Rosen |
| 6,304,173 B2 | 10/2001 | Pala et al. |
| 6,304,434 B1 | 10/2001 | Markow |
| 6,304,661 B1 | 10/2001 | Azima et al. |
| D450,667 S | 11/2001 | Scribner |
| D451,096 S | 11/2001 | Redmond |
| 6,321,416 B1 | 11/2001 | Lu |
| 6,324,052 B1 | 11/2001 | Azima et al. |
| 6,330,337 B1 | 12/2001 | Nicholson et al. |
| 6,339,455 B1 | 1/2002 | Allan et al. |
| 6,339,696 B1 | 1/2002 | Chan et al. |
| D454,121 S | 3/2002 | Lavelle et al. |
| 6,361,012 B1 | 3/2002 | Chang |
| 6,363,204 B1 | 3/2002 | Johnson et al. |
| D456,371 S | 4/2002 | Lavelle et al. |
| 6,364,390 B1 | 4/2002 | Finneman |
| 6,380,978 B1 | 4/2002 | Adams |
| 6,381,133 B1 | 4/2002 | Chen |
| D456,789 S | 5/2002 | Snyker |
| D457,506 S | 5/2002 | Scribner |
| 6,394,551 B1 | 5/2002 | Beukema |
| 6,404,622 B1 | 6/2002 | Chen |
| 6,409,242 B1 | 6/2002 | Chang |
| 6,412,848 B1 | 7/2002 | Ceccanese et al. |
| D461,850 S | 8/2002 | Hussaini et al. |
| D462,670 S | 9/2002 | Kasuga et al. |
| 6,446,925 B1 | 9/2002 | Wada |
| 6,466,278 B1 | 10/2002 | Harrison et al. |
| D465,492 S | 11/2002 | Scribner |
| D466,107 S | 11/2002 | Lum |
| 6,480,374 B1 | 11/2002 | Lee |
| D467,234 S | 12/2002 | Scribner |
| D467,562 S | 12/2002 | Chang |
| 6,493,546 B2 | 12/2002 | Patsiokas |
| D469,413 S | 1/2003 | To et al. |
| 6,510,049 B2 | 1/2003 | Rosen |
| D470,828 S | 2/2003 | Solland |
| 6,552,368 B2 | 2/2003 | Tuccinardi et al. |
| 6,532,152 B1 | 3/2003 | White et al. |
| 6,532,592 B1 | 3/2003 | Shintani et al. |
| 6,549,416 B2 | 4/2003 | Sterner et al. |
| 6,557,812 B2 | 5/2003 | Kutzehr et al. |
| D477,319 S | 7/2003 | Duan |
| 6,619,605 B2 | 9/2003 | Lambert |
| 6,668,407 B1 | 12/2003 | Reitzel |
| 6,669,285 B1 | 12/2003 | Park et al. |
| D485,812 S | 1/2004 | Park |
| 6,678,892 B1 | 1/2004 | Lavelle et al. |
| 6,688,407 B2 | 2/2004 | Etter et al. |
| 6,695,376 B1 | 2/2004 | Hirano |
| 6,698,832 B2 | 3/2004 | Boudinot |
| 6,719,343 B2 | 4/2004 | Emerling et al. |
| 6,724,317 B1 | 4/2004 | Kitano et al. |
| D489,416 S | 5/2004 | Chao |
| 6,739,654 B1 | 5/2004 | Shen et al. |
| D492,944 S | 7/2004 | Drakoulis et al. |
| 6,776,455 B2 | 8/2004 | Longtin et al. |
| D502,152 S | 2/2005 | Peng |
| 6,871,356 B2 | 3/2005 | Chang |
| 6,883,870 B2 | 4/2005 | Jost |
| 6,899,365 B2 | 5/2005 | Lavelle et al. |
| D508,900 S | 8/2005 | Kawan et al. |
| 6,928,654 B2 | 8/2005 | Tranchina et al. |
| D510,329 S | 10/2005 | Vitito |
| D510,330 S | 10/2005 | Peng |
| D511,332 S | 11/2005 | Vitito |
| 6,961,239 B2 | 11/2005 | Schedivy |
| D512,973 S | 12/2005 | Schedivy |
| 6,975,806 B1 | 12/2005 | Lavelle et al. |
| D515,522 S | 2/2006 | Vitito |
| 6,994,236 B2 | 2/2006 | Hsu |
| 7,019,794 B2 | 3/2006 | Norvell et al. |
| D521,524 S | 5/2006 | Chang |
| 7,036,879 B2 | 5/2006 | Chang |
| 7,040,697 B1 | 5/2006 | Tuccinardi et al. |
| 7,040,698 B2 | 5/2006 | Park |
| 7,044,546 B2 | 5/2006 | Chang |
| 7,050,124 B2 | 5/2006 | Schedivy |
| 7,066,544 B2 | 6/2006 | Tseng |
| 7,084,932 B1 | 8/2006 | Mathias et al. |
| 7,095,608 B2 | 8/2006 | Simmons et al. |
| 7,149,078 B2 | 12/2006 | Schedivy |
| 7,184,259 B2 | 2/2007 | Marler |
| 7,201,354 B1 | 4/2007 | Lee |
| 7,201,356 B2 | 4/2007 | Huang |
| 7,218,360 B2 | 5/2007 | Schedivy |
| 7,219,942 B2 | 5/2007 | Schedivy |
| 7,245,274 B2 | 7/2007 | Schedivy |
| 7,267,402 B2 | 9/2007 | Chang |
| 7,315,729 B2 | 1/2008 | Schedivy |
| 7,327,225 B2 | 2/2008 | Nicholas et al. |
| 7,333,009 B2 | 2/2008 | Schedivy |
| 7,334,243 B2 | 2/2008 | Chengalva et al. |
| D564,974 S | 3/2008 | Berg et al. |
| 7,352,355 B2 | 4/2008 | Troxell et al. |
| 7,354,091 B2 | 4/2008 | Lavelle et al. |
| 7,360,833 B2 * | 4/2008 | Vitito .............. B60K 35/00 297/217.3 |
| 7,379,125 B2 | 5/2008 | Chang |
| 7,440,275 B2 | 10/2008 | Schedivy |
| 7,448,679 B2 | 11/2008 | Chang |
| 7,460,187 B2 | 12/2008 | Schedivy |
| D592,647 S | 5/2009 | L'Henaff et al. |
| D592,648 S | 5/2009 | L'Henaff et al. |
| D592,649 S | 5/2009 | L'Henaff et al. |
| 7,548,413 B2 | 6/2009 | Schedivy et al. |
| 7,591,508 B2 | 9/2009 | Chang |
| 7,597,393 B1 * | 10/2009 | Tuccinardi .......... B60R 11/0211 297/188.04 |

(56) References Cited

U.S. PATENT DOCUMENTS

| | | | |
|---|---|---|---|
| 7,607,620 B2 * | 10/2009 | Ozolins | F16M 11/08 |
| | | | 248/122.1 |
| 7,636,930 B2 | 12/2009 | Chang | |
| 7,653,345 B2 | 1/2010 | Schedivy | |
| 7,661,759 B2 | 2/2010 | Koontz, II et al. | |
| 7,667,669 B2 | 2/2010 | Lavelle et al. | |
| 7,679,578 B2 | 3/2010 | Schedivy | |
| 7,728,855 B2 | 6/2010 | Sakuma | |
| 7,758,117 B2 | 7/2010 | Chang | |
| 7,762,627 B2 | 7/2010 | Chang | |
| 7,780,231 B2 | 8/2010 | Shalam et al. | |
| 7,788,770 B2 | 9/2010 | Vitito et al. | |
| 7,791,586 B2 | 9/2010 | Shalam | |
| 7,805,050 B2 | 9/2010 | Lavelle et al. | |
| 7,812,784 B2 | 10/2010 | Chang | |
| 7,839,355 B2 | 11/2010 | Lavelle et al. | |
| 7,857,176 B2 | 12/2010 | Schedivy | |
| 7,857,382 B2 | 12/2010 | Vitito | |
| 7,871,115 B2 | 1/2011 | Vitito et al. | |
| 7,885,603 B2 | 2/2011 | Santavicca | |
| 7,894,003 B2 | 2/2011 | Chang | |
| 7,909,396 B2 | 3/2011 | Vitito | |
| 7,909,397 B2 | 3/2011 | Shalam et al. | |
| 7,933,121 B2 | 4/2011 | Schedivy | |
| 7,954,894 B2 | 6/2011 | Schedivy et al. | |
| 8,136,777 B2 | 3/2012 | Brawner | |
| 8,141,948 B2 | 3/2012 | Cassellia et al. | |
| 8,162,395 B2 | 4/2012 | Vitito | |
| 8,186,034 B2 | 5/2012 | Vitito | |
| 8,201,203 B2 | 6/2012 | Vitito | |
| 8,203,657 B2 | 6/2012 | Vitito | |
| 8,243,215 B2 | 8/2012 | Schedivy | |
| 8,250,611 B2 | 8/2012 | Vitito | |
| 8,255,958 B2 | 8/2012 | Vitito | |
| 8,261,309 B2 | 9/2012 | Vitito | |
| 8,274,615 B2 | 9/2012 | Vitito | |
| 8,585,140 B2 | 11/2013 | Chang | |
| 8,595,140 B2 | 11/2013 | Kimura et al. | |
| 9,114,745 B2 | 8/2015 | Schedivy | |
| 9,340,133 B2 | 5/2016 | Chang | |
| 2001/0001083 A1 | 5/2001 | Helot | |
| 2001/0001319 A1 | 5/2001 | Beckert et al. | |
| 2001/0055071 A1 | 12/2001 | Kawai et al. | |
| 2002/0005917 A1 | 1/2002 | Rosen | |
| 2002/0085129 A1 | 7/2002 | Kitazawa | |
| 2002/0105507 A1 | 8/2002 | Tranchina et al. | |
| 2002/0113451 A1 | 8/2002 | Chang | |
| 2002/0149708 A1 | 10/2002 | Nagata et al. | |
| 2002/0186531 A1 | 12/2002 | Pokharna et al. | |
| 2003/0020840 A1 | 1/2003 | Hays et al. | |
| 2003/0021086 A1 | 1/2003 | Landry et al. | |
| 2003/0025367 A1 | 2/2003 | Boudinot | |
| 2003/0036357 A1 | 2/2003 | McGowan | |
| 2003/0112585 A1 | 6/2003 | Silvester | |
| 2003/0128183 A1 | 7/2003 | Chang | |
| 2003/0136888 A1 * | 7/2003 | Boele | F16M 11/041 |
| | | | 248/280.11 |
| 2003/0137584 A1 | 7/2003 | Norvell et al. | |
| 2003/0140352 A1 | 7/2003 | Kim | |
| 2003/0184137 A1 | 10/2003 | Jost | |
| 2003/0198008 A1 | 10/2003 | Leapman et al. | |
| 2003/0202005 A1 | 10/2003 | Sadahiro | |
| 2003/0222848 A1 | 12/2003 | Solomon et al. | |
| 2004/0007906 A1 | 1/2004 | Park et al. | |
| 2004/0011938 A1 * | 1/2004 | Oddsen, Jr. | F16M 11/10 |
| | | | 248/393 |
| 2004/0027311 A1 * | 2/2004 | Hunt | G09F 19/14 |
| | | | 345/4 |
| 2004/0032543 A1 | 2/2004 | Chang | |
| 2004/0080213 A1 | 4/2004 | Chang | |
| 2004/0083491 A1 | 4/2004 | Chang | |
| 2004/0085337 A1 | 5/2004 | Barrows | |
| 2004/0085485 A1 | 5/2004 | Schedivy | |
| 2004/0085718 A1 | 5/2004 | Imsand | |
| 2004/0086259 A1 | 5/2004 | Schedivy | |
| 2004/0125549 A1 | 7/2004 | Iredale | |
| 2004/0130616 A1 | 7/2004 | Tseng | |
| 2004/0160096 A1 | 8/2004 | Boudinot | |
| 2004/0212745 A1 | 10/2004 | Chang | |
| 2004/0212957 A1 | 10/2004 | Schedivy | |
| 2004/0227372 A1 | 11/2004 | Lavelle et al. | |
| 2004/0227695 A1 | 11/2004 | Schedivy | |
| 2004/0227696 A1 | 11/2004 | Schedivy | |
| 2004/0227861 A1 | 11/2004 | Schedivy | |
| 2004/0228622 A1 | 11/2004 | Schedivy | |
| 2004/0237111 A1 | 11/2004 | Iraclianos et al. | |
| 2005/0005298 A1 | 1/2005 | Tranchina | |
| 2005/0020320 A1 | 1/2005 | Lavelle et al. | |
| 2005/0024356 A1 | 2/2005 | Lavelle et al. | |
| 2005/0046756 A1 | 3/2005 | Chang | |
| 2005/0052046 A1 | 3/2005 | Lavelle et al. | |
| 2005/0066369 A1 | 3/2005 | Chang | |
| 2005/0098593 A1 | 5/2005 | Schedivy | |
| 2005/0099042 A1 | 5/2005 | Vitito | |
| 2005/0099495 A1 | 5/2005 | Vitito | |
| 2005/0099547 A1 | 5/2005 | Vitito | |
| 2005/0099548 A1 | 5/2005 | Vitito | |
| 2005/0102697 A1 | 5/2005 | Vitito | |
| 2005/0110313 A1 | 5/2005 | Vitito et al. | |
| 2005/0110913 A1 | 5/2005 | Vitito | |
| 2005/0122670 A1 | 6/2005 | Oh | |
| 2005/0132407 A1 | 6/2005 | Boyer, Jr. et al. | |
| 2005/0155068 A1 | 7/2005 | Chang | |
| 2005/0166238 A1 | 7/2005 | Vitito | |
| 2005/0174498 A1 | 8/2005 | Wu | |
| 2005/0200697 A1 | 9/2005 | Schedivy et al. | |
| 2005/0223406 A1 | 10/2005 | Vitito | |
| 2005/0232585 A1 | 10/2005 | Lavelle et al. | |
| 2005/0235326 A1 | 10/2005 | Vitito | |
| 2005/0235327 A1 | 10/2005 | Vitito | |
| 2005/0242636 A1 | 11/2005 | Vitito | |
| 2005/0242637 A1 | 11/2005 | Vitito | |
| 2005/0242638 A1 | 11/2005 | Vitito | |
| 2005/0249357 A1 | 11/2005 | Schedivy | |
| 2005/0251833 A1 | 11/2005 | Schedivy | |
| 2006/0023412 A1 | 2/2006 | Schedivy | |
| 2006/0034040 A1 | 2/2006 | Simmons et al. | |
| 2006/0047426 A1 | 3/2006 | Vitito | |
| 2006/0070102 A1 | 3/2006 | Vitito | |
| 2006/0070103 A1 | 3/2006 | Vitito | |
| 2006/0075934 A1 | 4/2006 | Ram | |
| 2006/0097537 A1 | 5/2006 | Schedivy | |
| 2006/0112144 A1 | 5/2006 | Ireton | |
| 2006/0119151 A1 | 6/2006 | Vitito | |
| 2006/0125295 A1 | 6/2006 | Schedivy | |
| 2006/0128303 A1 | 6/2006 | Schedivy | |
| 2006/0218595 A1 | 9/2006 | Chang | |
| 2006/0227212 A1 | 10/2006 | Schedivy | |
| 2006/0236345 A1 | 10/2006 | Schedivy | |
| 2006/0238529 A1 | 10/2006 | Lavelle et al. | |
| 2006/0290835 A1 | 12/2006 | Sakuma | |
| 2007/0001492 A1 | 1/2007 | Chang | |
| 2007/0001493 A1 | 1/2007 | Chang | |
| 2007/0008094 A1 | 1/2007 | Schedivy | |
| 2007/0052618 A1 | 3/2007 | Shalam | |
| 2007/0057541 A1 | 3/2007 | Huang | |
| 2007/0070259 A1 | 3/2007 | Schedivy | |
| 2007/0091015 A1 | 4/2007 | Lavelle et al. | |
| 2007/0096517 A1 | 5/2007 | Chang | |
| 2007/0096518 A1 | 5/2007 | Chang | |
| 2007/0097210 A1 | 5/2007 | Chang | |
| 2007/0101372 A1 | 5/2007 | Chang | |
| 2007/0105444 A1 | 5/2007 | Macholz | |
| 2007/0108788 A1 | 5/2007 | Shalam et al. | |
| 2007/0164609 A1 | 7/2007 | Shalam et al. | |
| 2008/0067842 A1 | 3/2008 | Chang | |
| 2008/0093956 A1 | 4/2008 | Maxson | |
| 2008/0157574 A1 | 7/2008 | LaRussa | |
| 2008/0165293 A1 | 7/2008 | Tranchina | |
| 2008/0191505 A1 | 8/2008 | Schedivy | |
| 2008/0246319 A1 | 10/2008 | Chang | |
| 2008/0246320 A1 | 10/2008 | Chang | |
| 2008/0252118 A1 | 10/2008 | Chang | |
| 2009/0013357 A1 | 1/2009 | Cassellia et al. | |

(56) References Cited

U.S. PATENT DOCUMENTS

| | | |
|---|---|---|
| 2009/0021036 A1 | 1/2009 | Chang |
| 2009/0235513 A1 | 9/2009 | Chang |
| 2009/0315368 A1 | 12/2009 | Mitchell |
| 2010/0017827 A1 | 1/2010 | Shalam et al. |
| 2010/0067884 A1 | 3/2010 | Schedivy |
| 2010/0146563 A1 | 6/2010 | Chang |
| 2010/0211708 A1 | 8/2010 | Rohaly et al. |
| 2010/0246155 A1 | 9/2010 | Snider et al. |
| 2011/0133530 A1 | 6/2011 | Chang |
| 2011/0167460 A1 | 7/2011 | Tranchina |
| 2011/0181796 A1 | 7/2011 | Caltabiano et al. |
| 2012/0162891 A1 | 6/2012 | Tranchina et al. |
| 2014/0191542 A1 | 7/2014 | Chang |

FOREIGN PATENT DOCUMENTS

| | | |
|---|---|---|
| DE | 3721377 | 1/1989 |
| DE | 4118711 | 12/1992 |
| DE | 19943696 | 3/2001 |
| EP | 0784400 | 7/1997 |
| EP | 0976616 | 8/1999 |
| FR | 2817812 | 12/2000 |
| FR | 2829980 | 9/2001 |
| GB | 2276059 A | 9/1994 |
| JP | 58128942 A | 8/1983 |
| JP | 61161151 U | 10/1986 |
| JP | 6415479 | 1/1989 |
| JP | 194048 | 4/1989 |
| JP | 194049 | 4/1989 |
| JP | 217777 U | 2/1990 |
| JP | 2144242 A | 6/1990 |
| JP | 2158437 | 6/1990 |
| JP | 2158437 A | 6/1990 |
| JP | 3-10476 A | 1/1991 |
| JP | 38513 Y | 3/1991 |
| JP | 3189620 A | 8/1991 |
| JP | 345875 Y | 9/1991 |
| JP | 3-122482 U | 12/1991 |
| JP | 45142 A | 1/1992 |
| JP | 4201639 A | 7/1992 |
| JP | 538981 A | 2/1993 |
| JP | 550883 A | 3/1993 |
| JP | 597098 A | 4/1993 |
| JP | 657251 U | 8/1994 |
| JP | 640021 | 10/1994 |
| JP | 78680 A | 2/1995 |
| JP | 741401 | 9/1995 |
| JP | 9224202 A | 8/1997 |
| JP | 1075389 U | 3/1998 |
| JP | 11151986 | 6/1999 |
| JP | 2001047921 A | 2/2001 |
| JP | 2001256768 A | 9/2001 |
| JP | 2001354074 | 12/2001 |
| JP | 200425949 A | 1/2004 |
| JP | 200481385 A | 3/2004 |
| JP | 2004231158 A | 8/2004 |
| JP | 2004231159 A | 8/2004 |
| JP | 2004529688 A | 9/2004 |
| JP | 2005503904 A | 2/2005 |
| JP | 2005525856 A | 9/2005 |
| JP | 2005532224 A | 10/2005 |
| KR | 19990027444 | 7/1999 |
| KR | 20000014983 | 7/2000 |
| KR | 200207307 | 10/2000 |
| KR | 2002556470 | 12/2001 |
| SE | 63872 | 6/1924 |
| SE | 63912 | 6/1999 |
| SE | 63913 | 6/1999 |
| TW | 483319 | 4/2002 |
| WO | 0038951 A1 | 7/2000 |
| WO | 02074577 A1 | 9/2002 |
| WO | 03029050 A1 | 10/2003 |
| WO | 04005077 A1 | 1/2004 |
| WO | 05038628 A1 | 4/2005 |
| WO | 03001885 A1 | 1/2009 |

OTHER PUBLICATIONS

Stipulated Constructions of Claim Terms, U.S. District Court for the Central District of California, *Johnson Safety, Inc.* (Plaintiff-Counterdefendant) v. *Voxx International Corporation; Voxx Electronics Corporation; and Invision Automotive Systems Inc.* (Defendants-Counterclaimants), Case No. 14-cv-2591-ODW (DTB), Dec. 1, 2016, 6 pgs.

Plaintiff's Opening Claim Construction Brief for Plaintiff's Patents-in-Suit, U.S. District Court for the Central District of California, *Johnson Safety, Inc.* (Plaintiff-Counterdefendant) v. *Voxx International Corporation; Voxx Electronics Corporation; and Invision Automotive Systems Inc.* (Defendants-Counterclaimants), Case No. 14-cv-2591-ODW (DTB), Jan. 8, 2016, 31 pgs.

Parties' Final Joint Claim Chart, U.S. District Court for the Central District of California, *Johnson Safety, Inc.* (Plaintiff-Counterdefendant) v. *Voxx International Corporation; Voxx Electronics Corporation; and Invision Automotive Systems Inc.* (Defendants-Counterclaimants), Case No. 5: 14-cv-02591-ODW(DTBx), Jan. 8, 2016, 6 pgs.

Parties' Proposed Constructions and Supporting Evidence for Disputed Claim Terms of the Patents in Suite, Ex. A to Final Joint Claim Chart, Case No. 5:14-cv-02591-ODW-DTB, Jan. 8, 2016, 37 pgs.

Plaintiff's Reply Claim Construction Brief for Plaintiff's Patents-in-Suit, U.S. District Court for the Central District of California, *Johnson Safety, Inc.* (Plaintiff-Counterdefendant) v. *Voxx International Corporation; Voxx Electronics Corporation; and Invision Automotive Systems Inc.* (Defendants-Counterclaimants), Case No. 14-cv-2591-ODW(DTB), Jan. 25, 2016, 18 pgs.

Plaintiff's Responsive Claim Construction Brief for Defendants' Patents-in-Suit, U.S. District Court for the Central District of California, *Johnson Safety, Inc.* (Plaintiff-Counterdefendant) v. *Voxx International Corporation; Voxx Electronics Corporation; and Invision Automotive Systems Inc.* (Defendants-Counterclaimants), Case No. 14-cv-2591-ODW (DTB), Jan. 19, 2016, 30 pgs.

Voxx's Opening Claim Construction Brief, U.S. District Court for the Central District of California, *Johnson Safety, Inc.* (Plaintiff-Counterdefendant) v. *Voxx International Corporation; Voxx Electronics Corporation; and Invision Automotive Systems Inc.* (Defendants-Counterclaimants), Case No. 5:14-cv-02591-ODW-DTB, Jan. 8, 2016, 29 pgs.

Voxx's Responsive Claim Construction Brief, U.S. District Court for the Central District of California, *Johnson Safety, Inc.* (Plaintiff) v. *Voxx International Corporation; Voxx Electronics Corporation; and Invision Automotive Systems Inc.* (Defendants), Case No. 5:14-cv-2591-ODW(DTBx, Jan. 19, 2016, 11 pgs.

Voxx's Reply to Johnson Safety's Response to Voxx's Opening Claim Construction Brief, U.S. District Court for the Central District of California, *Johnson Safety, Inc.* (Plaintiff-Counterdefendant) v. *Voxx International Corporation; Voxx Electronics Corporation; and Invision Automotive Systems Inc.* (Defendants-Counterclaimants), Case No. 5:14-cv-2591-ODW-DTB, Jan. 25, 2016, 17 pgs.

Joint Appendix of Extrinsic Evidence, U.S. District Court for the Central District of California, *Johnson Safety, Inc.* (Plaintiff) v. *Voxx International Corporation; Voxx Electronics Corporation; and Invision Automotive Systems Inc.* (Defendants), Case No. 5:14-cv-02591-ODW (DTBx), Jan. 25, 2016, 4 pgs.

JSI Extrinsic Evidence: Exhibits C-H, Exhibit O, Exhibit Q, Jan. 25, 2016, Case No. 5:14-cv-02591-ODW-DTB, 74 pgs.

Voxx Extrinsic Evicence: Exhibit A, Jan. 25, 2016, Case No. 5:14-cv-02591-ODW-DTB, 15 pgs.

Petition for Inter Partes Review of U.S. Pat. No. 8,585,140 Under 35 U.S.C. 311-319 and 37 C.F.R. 42, *Voxx International Corporation* (Petitioner) v. *Johnson Safety, Inc.* (Patent Owner), U.S. Patent and Trademark Office Before the Patent Trial and Appeal Board, Dec. 30, 2016, 49 pgs.

Parties' P.R. 4-3 Joint Claim Construction and Prehearing Statement with Exhibits A.1-E.2, District Court for the Central District of California, *Johnson Safety, Inc.* (Plaintiff-Counterdefendant) v. *Voxx International Corporation; Voxx Electronics Corporation; and Invi-*

(56) References Cited

OTHER PUBLICATIONS sion Automotive Systems Inc. (Defendants-Counterclaimants), Case No. 5:14-cv-02591-ODW(DTBx), Nov. 23, 2015, 98 pgs.
Voxx's Preliminary Invalidity Contentions with Exhibits A-E, U.S. District Court for the Central District of California, *Johnson Safety, Inc.* (Plaintiff) v. *Voxx International Corporation; Voxx Electronics Corporation; and Invision Automotive Systems Inc.* (Defendants), Case No. 5:14-cv-02591-ODW(DTBx), Sep. 28, 2015, 5 pgs.
VOXX International Corporation's, et al. Notice of Service of Amended Invalidity Contentions, United States District Court for the Central District of California, *Johnson Safety, Inc.* (Plaintiff) v. *VOXX International Corporation, VOXX Electronics Corporation, and Invision Automotive Systems, Inc.*, Jan. 20, 2017, 7 pgs.
Popular Mechanics, "Digital Dreams in Sin City," by Tobey Grumet, May 2000, 6 pgs. (pp. 96-104).
Popular Mechanics, "Desktop Theater", by Steve Ditlea, Oct. 1999, 3 pgs. (pp. 88-91).
PC Magazine, "PC Buyer's Guide", Dec. 3, 2002, 2 pgs.
PC Magazine, "How to Network your Home", Apr. 8, 2003, pp. 106-112.
Audiovox Corporation, LCM56, Owner's Manual, 2002, 12 pgs.
Audiovox, LCM-5600NP, 5.6" Active Matrix LCD Monitor, Owner's Manual, 2001, 8 pgs.
Audiovox Electronics Corp., LCM5869NP & LCM7069NP Remote Controlled Color Display Monitor, Installation and Owner's Manual, Mar. 27, 2002, 22 pgs.
Audiovox Electronics Corp., LCM5043NP & LCM5643NP Remote Controlled Color Display Monitor with Headphone Jack, Installation and Owner's Manual, Mar. 25, 2002, 20 pgs.
Audiovox, LCM-4000, 4" Active Matrix LCD Monitor, Owner's Manual, 2000, 8 pgs.
Audiovox Corporation, LCM-0565, 5.6" Active Matrix LCD Monitor, Owner's Manual, 2000, 8 pgs.
Audiovox Corporation, LCM-0505, 5" Active Matrix LCD Monitor, Owner's Manual, 2000, 8 pgs.
Audiovox Electronics Corp., LCM500NP 5 Inch Monitor with 2 Video Input Capability, Installation and Operation Manual, 2001, 16 pgs.
Directed Video Headrest Video Monitor Owner's Manual/ Installation Guide HVM500.
Audivox Corporation, LCM640 Owner's Manual and Installation Guide.
Audivox Corporation, LCM640TV Owner's Manual, Flip down LCD In-Vehicle Television Entertainment System.
Unsolicited letter from Trakker Technologies, Inc., dated Sep. 20, 2005.
"Multimedia halt Einzug im Auto", pp. 38-39, Automotive Electronics 2000.
HR7DDPKG Installation Manual, Audiovox Electronics Corp., dated 2004.
HR9000PGK Installation Manual, Audiovox Electronics Corp., dated 2006.
Request for Reexamination of U.S. Pat. No. 6,871,356, dated Jul. 28, 2005 (U.S. Reexamination No. 95/000,103).
Order Granting Request for Reexamination of U.S. Pat. No. 6,871,356, dated Sep. 29, 2005 (U.S. Reexamination No. 95/000,103).
Action Closing Prosecution for Reexamination of U.S. Pat. No. 6,871,356, dated Sep. 29, 2005 (U.S. Reexamination No. 95/000,103).
Examiner's Answer during appeal of Reexamination of U.S. Pat. No. 6,871,356, dated Nov. 20, 2007 (U.S. Reexamination No. 95/000,103).
Decision on Appeal of Reexamination of U.S. Pat. No. 6,871,356, dated Jun. 25, 2009 (U.S. Reexamination No. 95/000,103).
Office Action for U.S. Appl. No. 10/361,897, now U.S. Pat. No. 6,871,356, dated Aug. 7, 2003.
Office Action for U.S. Appl. No. 10/361,897, now U.S. Pat. No. 6,871,356, dated Feb. 26, 2004.
Office Action for U.S. Appl. No. 10/361,897, now U.S. Pat. No. 6,871,356, dated Aug. 23, 2004.
Compaq Tablet PC TC1000 product summary dated Sep. 3, 2002.
Compaq Tablet PC TC1000 "Getting Started" guide dated Nov. 2002.
Compaq Tablet PC TC1000 Docking Station Refrence Guide dated Nov. 2002.
Panasonic Color Television Operating Instructions CT-27SX32 dated 2002.
U.S. Appl. No. 10/985,262, filed Nov. 10, 2004 titled Mobile Video System.
U.S. Reexamination No. 95/000,103 of U.S. Pat. No. 6,871356 filed Aug. 1, 2005.
U.S. Reexamination No. 95/000,007 of U.S. Pat. No. 6,339,455 filed Dec. 16, 2002.
U.S. Appl. No. 12/124,082, filed May 20, 2008 titled Flat Thin Sceen TV/Monitor Automotive Roof Mount.
U.S. Appl. No. 11/475,735, filed Jun. 26, 2006 titled Headrest Mounted Entertainment System.
U.S. Appl. No. 12/103,618, filed Apr. 15, 2008 titled Headrest-Mounted Entertainment Systems.
U.S. Appl. No. 12/103,638, filed Apr. 15, 2008 titled Headrest-Mounted Entertainment Systems.
U.S. Appl. No. 11/475,734, filed Jun. 26, 2006 titled Headrest Mounted Entertainment System.
U.S. Appl. No. 11/475,720, filed Jun. 26, 2006 titled Headrest Mounted Entertainment System.
Reissue U.S. Appl. No. 10/430,713 of U.S. Appl. No. 09/474,582, filed May 5, 2003.
U.S. Appl. No. 12/103,651, filed Apr. 15, 2008 titled Headrest-Mounted Entertainment Systems.
U.S. Appl. No. 11/777,936, filed Jul. 13, 2007 titled Headrest Mounted Monitor.
U.S. Appl. No. 12/614,634, filed Nov. 6, 2009 titled Mobile Video System.
U.S. Appl. No. 12/124,082, filed May 20, 2008 titled Flat Thin Screen TV/Monitor Automotive Roof Mount.
U.S. Appl. No. 12/830,223, filed Jul. 2, 2010 titled Headrest-Mounted Entertainment Systems.
U.S. Appl. No. 11/475,729, filed Jun. 26, 2006 titled Headrest Mounted Entertainment System.
U.S. Appl. No. 12/252,026, filed Oct. 15, 2008 titled Headrest-Mounted Monitor.
U.S. Appl. No. 13/874,673, filed May 28, 2013 titled Headrest-Mounted Entertainment Systems.
U.S. Appl. No. 13/858,695, filed Apr. 8, 2013 titled Mobile Video System.

\* cited by examiner

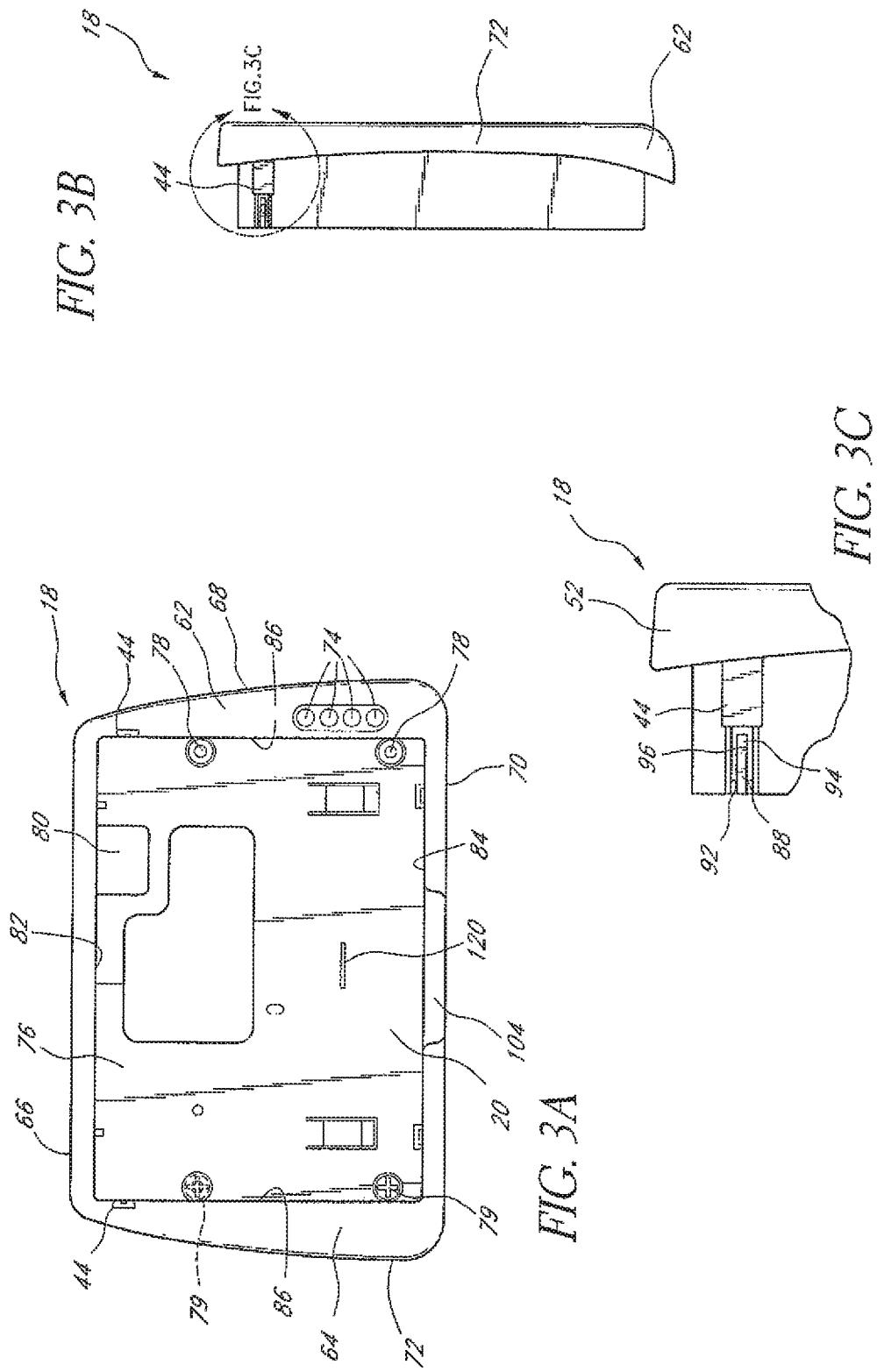

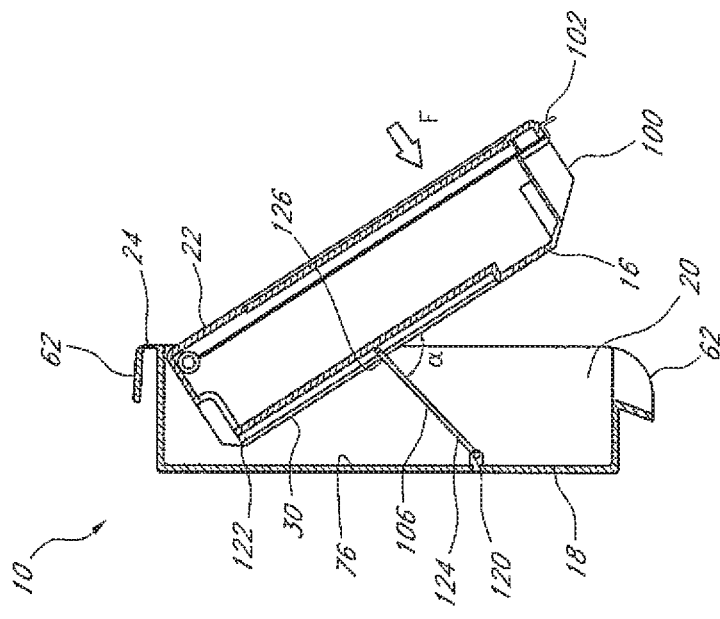
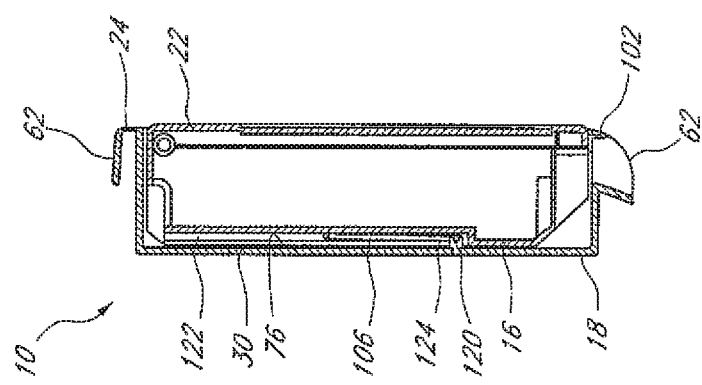

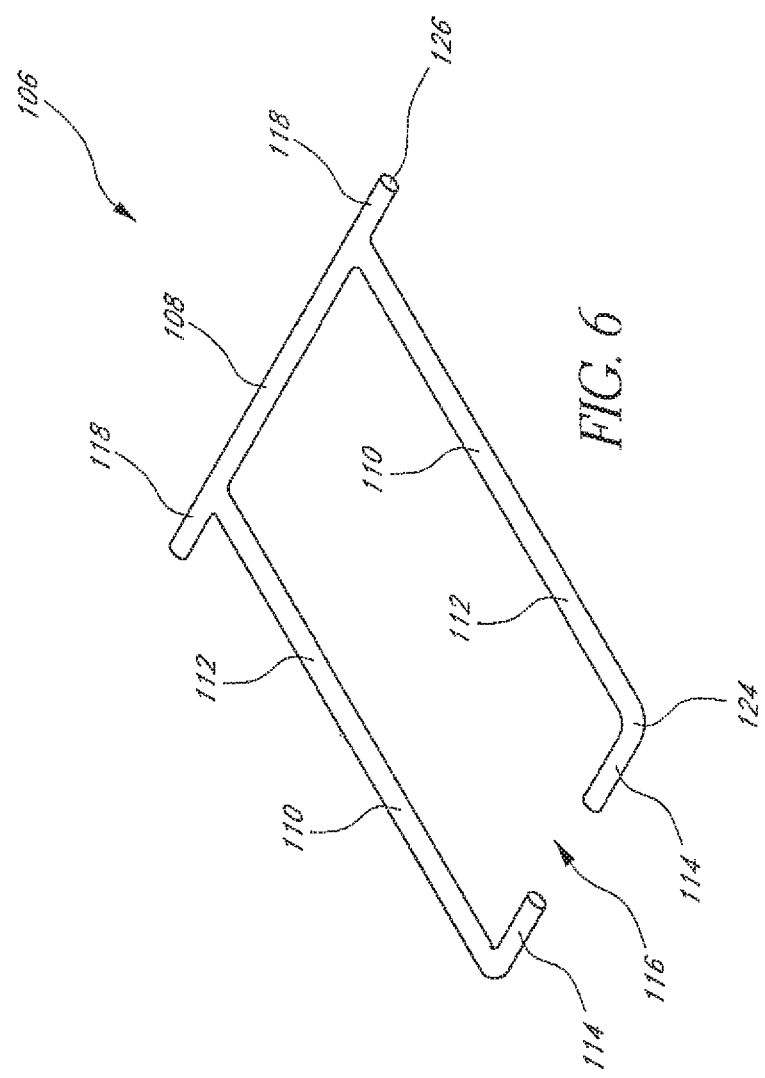

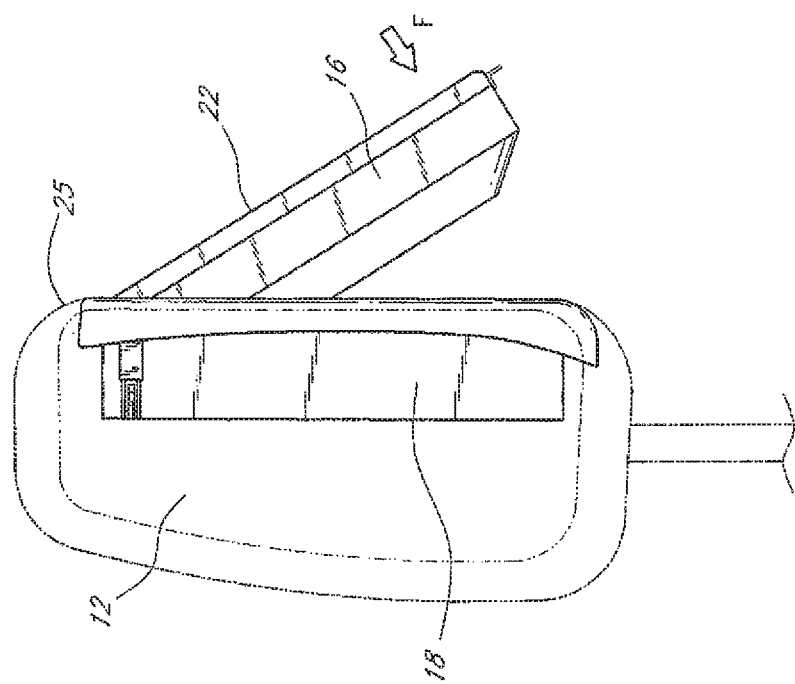
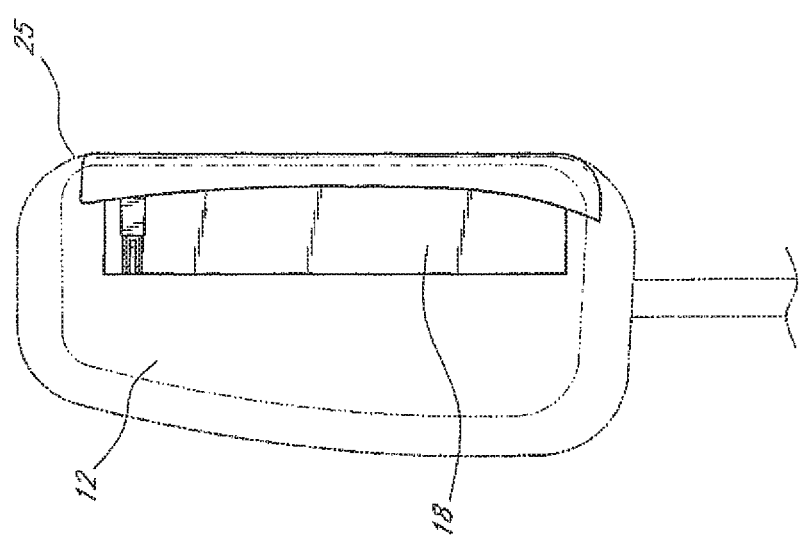

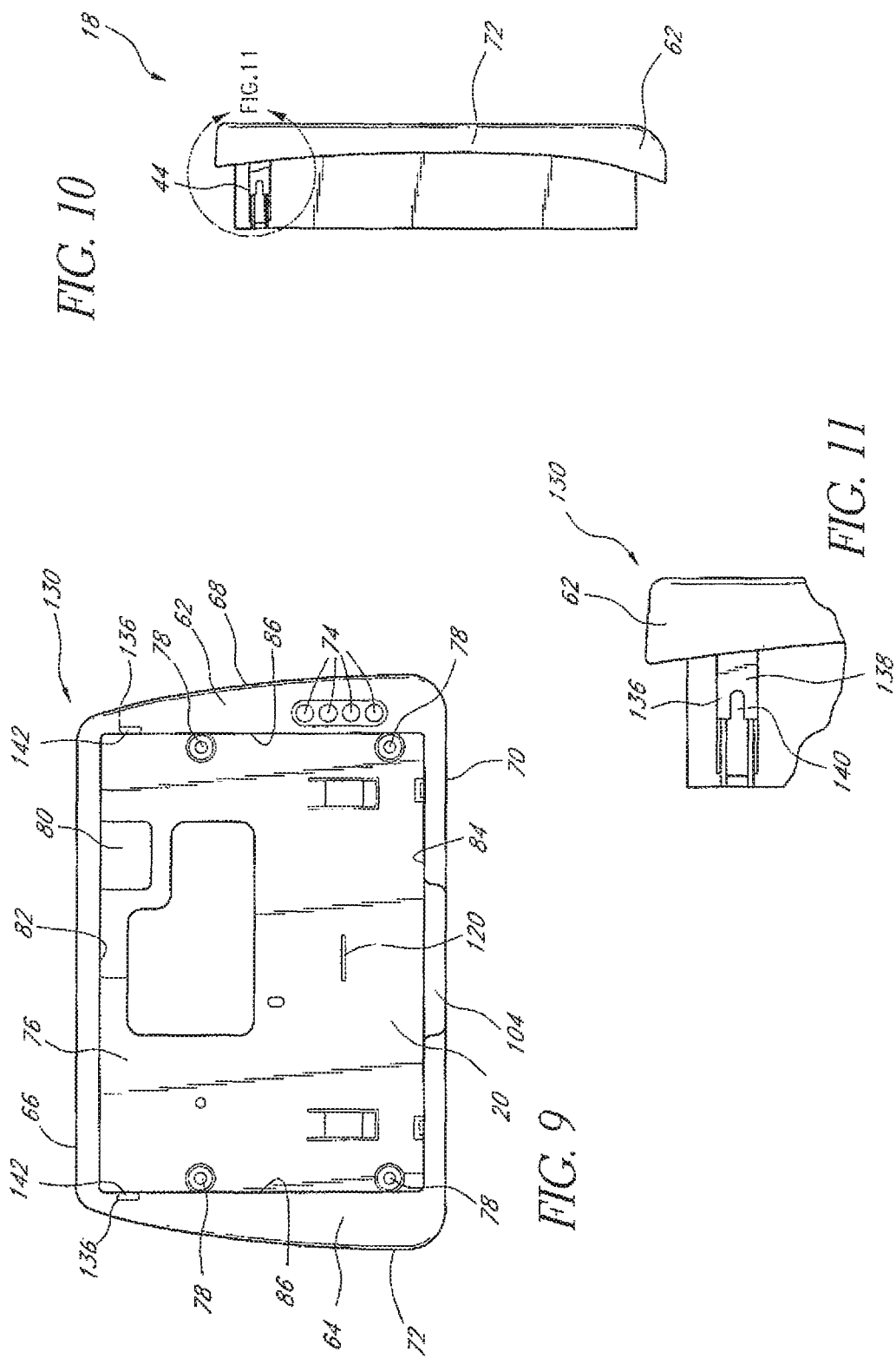

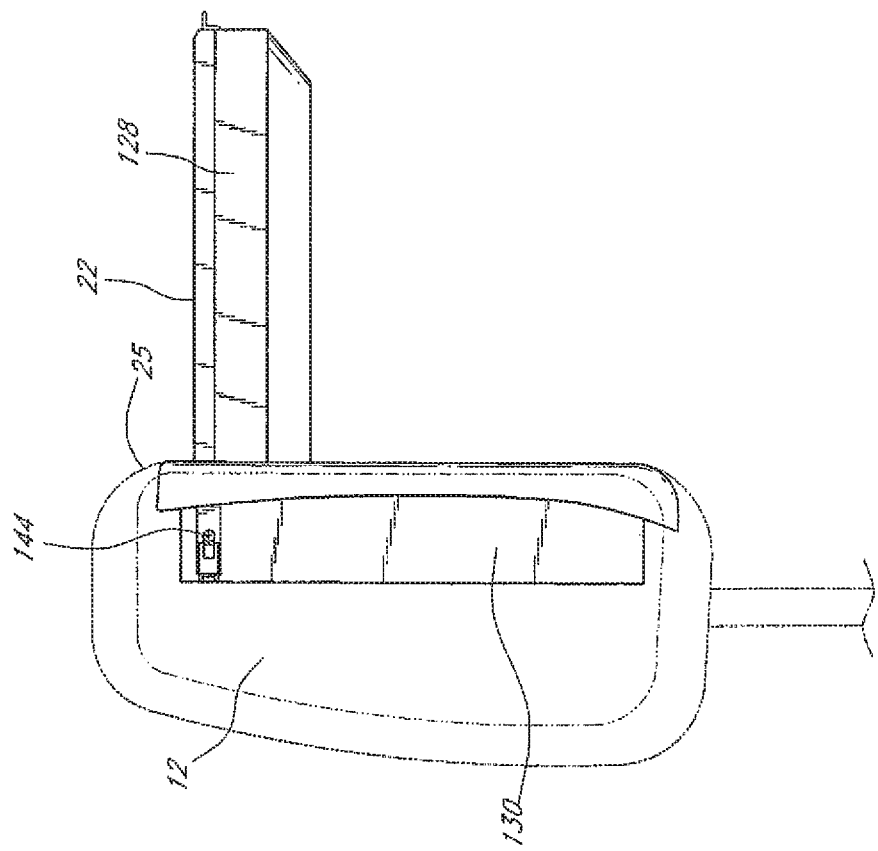
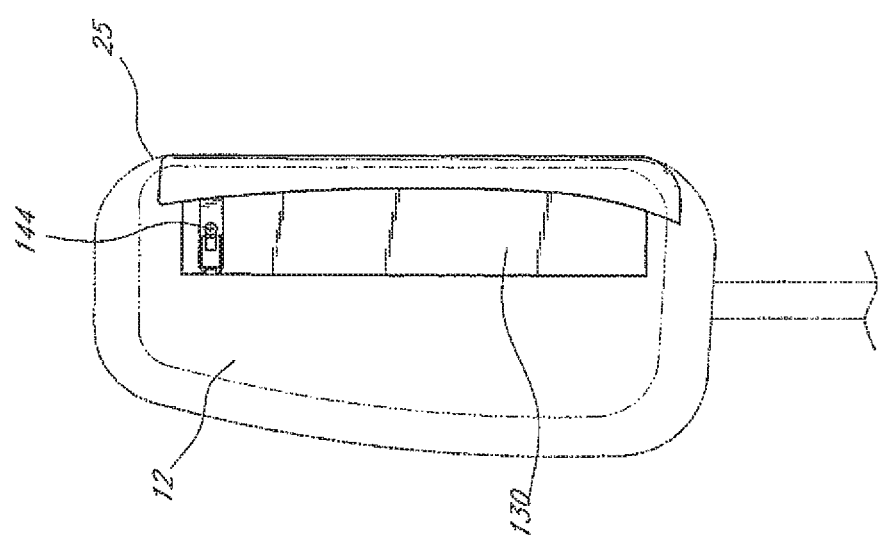

HEADREST-MOUNTED MONITOR

RELATED APPLICATIONS

This application is a Continuation of co-pending U.S. application Ser. No. 14/079,426 entitled "Headrest-Mounted Monitor" filed Nov. 13, 2013, which is a Continuation of U.S. application Ser. No. 12/475,332 filed May 29, 2009, issued on Nov. 26, 2013 as U.S. Pat. No. 8,595,140 B2, which is a Continuation of U.S. application Ser. No. 11/777, 936 filed Jul. 13, 2007, which is abandoned, which is a Continuation of U.S. application Ser. No. 11/401,475 filed Apr. 10, 2006, which issued on Sep. 11, 2007 as U.S. Pat. No. 7,267,402 B2, which is a Continuation of U.S. application Ser. No. 10/762,630 filed Jan. 20, 2004, which issued on May 16, 2006 as U.S. Pat. No. 7,044,546 B2, which is a Continuation-in-Part of U.S. application Ser. No. 10/219, 987 filed Aug. 14, 2002, which issued on May 2, 2006 as U.S. Pat. No. 7,036,879 B2, which claims the benefit under provisions of 35 U.S.C. § 119(e) of U.S. Provisional Application No. 60/451,232 filed Feb. 28, 2003, which are incorporated herein by reference.

BACKGROUND

The present invention relates to visual display units for use in vehicles, such as automobiles and aircraft. More specifically, the present monitor is adapted to be mounted in a headrest of a vehicle seat.

DESCRIPTION OF THE RELATED ART

Monitors for displaying visual images have been commonplace aboard commercial aircraft and motor coaches for quite some time. For example, U.S. Pat. No. 5,267,775 to Nguyen and U.S. Pat. No. 5,507,556 to Dixon disclose monitors that are adapted to be mounted in a seat back of an aircraft seat. Neither of these monitors is adapted for use in an automobile.

Disadvantageously, each of these monitors pivots automatically with the seat back. A viewer cannot adjust a viewing angle of either monitor independently of a recline angle of the seat back. This limitation prevents a viewer from adjusting the monitor to minimize glare. In an automobile a position and orientation of the vehicle relative to the sun is constantly changing. The movement creates glare at certain times, and viewers prefer to be able to adjust the screen to eliminate the glare. Thus, any monitor for use in an automobile is preferably adjustable so that viewers can minimize glare.

The Nguyen monitor pivots about a lower edge, and pivots into the seat back when a passenger reclines the seat back. Thus, the Nguyen monitor occupies a relatively large depth of the seat back. This configuration is not suitable for use in an automobile headrest, where space is very limited.

The Dixon monitor pivots about an axis located in the upper half of the housing. The axis is spaced downward and inward from the upper outer edge of the monitor (see FIGS. 3-5). The Dixon monitor pivots away from the seat back when a passenger reclines the seat back. However, because of the location of the pivot axis, an upper rear edge of the Dixon monitor moves toward the seat back when the monitor pivots. Like the Nguyen monitor, this configuration occupies a relatively large depth of the seat back and is not well adapted for use in an automobile headrest, where space is very limited. Further, when the seat of Dixon is in a reclined position, and the monitor is in a position such that a lower edge thereof protrudes from the seat back, tension in a cable within the seat back holds the monitor in position. Thus, if a passenger strikes the monitor in this position, he or she could be injured because the monitor will not retract into the seat back. This configuration is also not appropriate for use in an automobile headrest, where during emergency braking passengers are frequently thrown forward.

Monitors have recently become more popular in private passenger vehicles where space is more limited than in aircraft and motor coaches. For example, U.S. Pat. No. 5,842,715 to Jones, and U.S. Pat. No. 6,250,976 to Chu disclose monitors that are adapted to be mounted in a head rest of an automobile seat. The Jones and Chu monitors are adapted to be mounted in an automobile headrest. However, neither of these monitors is adjustable independently of the headrest.

Unfortunately, none of these patents teaches a monitor that is adapted to be mounted within an automobile headrest, and is independently adjustable by a viewer to provide an optimum viewing angle and to reduce glare.

Several monitors for use in private passenger vehicles include a plastic housing that is mounted to the vehicle headrest. The housing is glued into a cavity within the headrest, and the screen structure is securable within the housing using a variety of different attachment methods. For example, the housing may include tabs that snap into slots on the screen structure. Unfortunately, the connections between these screen structures and their respective housings are not very sturdy. Furthermore, the glued connections between the housings and their respective headrests are not very sturdy. Thus, during a vehicle collision, the screen structures tend to detach from their housings, and the housings tend to detach from their headrests. The loose screen structures and housings drifting about the passenger compartment pose a threat to the passenger's safety.

SUMMARY OF THE INVENTION

The preferred embodiments of the headrest-mounted monitor have several features, no single one of which is solely responsible for their desirable attributes. Without limiting the scope of this headrest-mounted monitor as expressed by the claims that follow, its more prominent features will now be discussed briefly. After considering this discussion, and particularly after reading the section entitled "Detailed Description of the Preferred Embodiments," one will understand how the features of the preferred embodiments provide advantages, which include adaptability to mounting in an automobile headrest, independent adjustability, sturdy connection between housing and headrest, sturdy connection between monitor and housing, and low risk of injury to passengers.

One preferred embodiment of the present monitor comprises a housing defining a first hinge portion. The housing is mounted to a headrest of a vehicle seat. The monitor further comprises a screen structure defining a second hinge portion. The second hinge portion cooperates with the first hinge portion to pivotably secure the screen structure to the housing.

Another preferred embodiment of the present monitor is adapted to be mounted to a headrest of a vehicle seat. The monitor comprises a housing defining a storage cavity and a first hinge portion adjacent an upper edge thereof. The monitor further comprises a screen structure defining a second hinge portion adjacent an upper edge thereof. The second hinge portion cooperates with the first hinge portion to pivotably secure the screen structure to the housing. The screen structure is adapted to fit substantially within the storage cavity when the screen structure is in a storage configuration. An angular orientation of the screen structure relative to the housing is adjustable without moving the headrest or the seat.

Another preferred embodiment of the present monitor is adapted to be mounted to a headrest of a vehicle seat. The monitor comprises a housing defining a storage cavity and a first hinge portion adjacent an upper edge. The monitor further comprises a screen structure defining a second hinge portion adjacent an upper edge. The second hinge portion cooperates with the first hinge portion to pivotably secure the screen structure to the housing. The screen structure is adapted to fit substantially within the storage cavity when the screen structure is in a storage configuration. When the screen structure is in a viewing configuration, a lower edge of the screen structure protrudes from the housing. When the screen structure is in the viewing configuration, a pushing force applied to a front face of the screen structure adjacent a lower edge thereof pivots the screen structure to a position toward the storage configuration. Upon removal of the force, the screen structure remains in said position.

Another preferred embodiment of the present monitor is adapted to be mounted to a headrest of a vehicle seat. The monitor comprises a housing having a first hinge portion and having a pivot aperture attached to a floor thereof. The monitor further comprises a screen structure having a second hinge portion and a channel in a rear surface. The second hinge portion cooperates with the first hinge portion to pivotably secure the screen structure to the housing. The monitor further comprises a bracket having a first end pivotably retained within the pivot aperture and a second end slidably retained within the channel.

Another preferred embodiment of the present monitor is adapted to be mounted to a headrest of a vehicle seat. The monitor comprises a screen structure defining first and second hinge portions adjacent an upper edge thereof. The monitor further comprises a housing defining a storage cavity adapted to receive the screen structure, and a surface adjacent an upper edge thereof for receiving the first hinge portion. A fastening member secures the first hinge portion to the housing surface. The first and second hinge portions cooperate to pivotably secure the screen structure to the housing.

Another preferred embodiment of the present monitor is adapted to be mounted to a headrest of a vehicle seat. The monitor comprises a screen structure defining first and second hinge portions, and a housing defining a surface for receiving the first hinge portion. The housing is mounted to a headrest of a vehicle seat. The first hinge portion is secured to the housing surface, such that the second hinge portion cooperates with the first hinge portion to pivotably secure the screen structure to the housing, and the screen structure is pivotable ninety-degrees with respect to the housing.

Another preferred embodiment of the present monitor is adapted to be mounted to a headrest of a vehicle seat. The monitor comprises a screen structure defining a post and a first hinge portion pivotably connected thereto. The post is secured adjacent an upper edge of the screen structure. The monitor further comprises a housing defining a storage cavity adapted to receive the screen structure, and a surface adjacent an upper edge thereof for receiving the first hinge portion. The first hinge portion pivotably secures the screen structure to the housing. The post and the first hinge portion are constructed of a sturdy material designed to resist separation of the screen structure and housing.

BRIEF DESCRIPTION OF THE DRAWINGS

The preferred embodiments of the headrest-mounted monitor, illustrating its features, will now be discussed in detail. These embodiments depict the novel and nonobvious headrest-mounted monitor shown in the accompanying drawings, which are for illustrative purposes only. These drawings include the following figures, in which like numerals indicate like parts:

FIG. 3A is a front elevation view of the housing of the headrest-mounted monitor of FIG. 1;

FIG. 3B is a left side elevation view of the housing of FIG. 3A;

FIG. 3C is a detail view of the second hinge portion of the housing of FIG. 3A;

FIG. 5A is a left side section view of the headrest-mounted monitor of FIG. 1, illustrating the screen structure in a storage position;

FIG. 5B is a left side section view of the headrest-mounted monitor of FIG. 1, illustrating the screen structure pivoted outward from the housing;

FIG. 6 is a perspective view of the bracket of the headrest-mounted monitor of FIG. 1;

FIG. 7A is a left side elevation view of the headrest-mounted monitor and headrest of FIG. 1, illustrating the screen structure in a storage position;

FIG. 7B is a left side elevation view of the headrest-mounted monitor and headrest of FIG. 1, illustrating the screen structure pivoted outward from the housing.

FIG. 9 is a front elevation view of another preferred embodiment of the housing of the headrest-mounted monitor of FIG. 1;

FIG. 10 is a left side elevation view of the housing of FIG. 9;

FIG. 11 is a detail view of the second hinge portion of the housing of FIG. 9;

FIG. 12 is a left side elevation view of the headrest-mounted monitor and headrest of FIG. 1, including the screen structure of FIG. 8, illustrating the screen structure in a storage position; and FIG. 13 is a left side elevation view of the headrest-mounted monitor and headrest of FIG. 1, including the screen structure of FIG. 8, illustrating the screen structure pivoted outward from the housing.

DETAILED DESCRIPTION OF THE PREFERRED EMBODIMENTS

Figure 1:
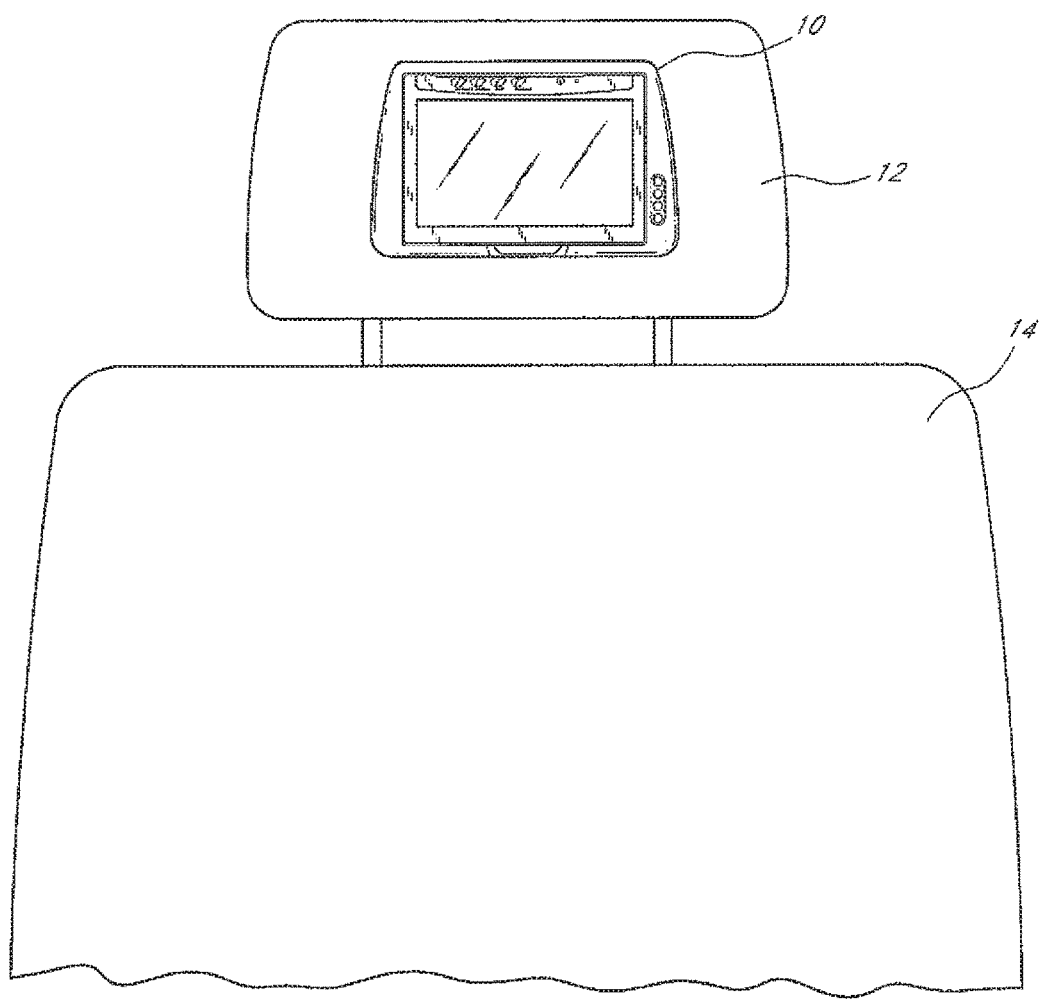
FIG. 1 is a front elevation view of a preferred embodiment of the headrest-mounted m onitor according to the present invention, illustrating the monitor installed in a headrest of a vehicle seat.

FIG. 1 illustrates a preferred embodiment of a monitor 10 disposed within a headrest 12. The headrest 12 is mounted to a vehicle seatback 14, and 12 is movable independently of the seatback 14 toward and away from the seatback 14. The monitor 10 preferably faces a rear of the vehicle so that images displayed on the monitor 10 are visible to passengers seated behind the seatback 14. Features of the monitor 10, which are described in detail below, reduce the risk of injury to passengers presented by the monitor 10, and enable the monitor 10 to be mounted in the very limited space available within a typical vehicle headrest 12.

Figure 4:
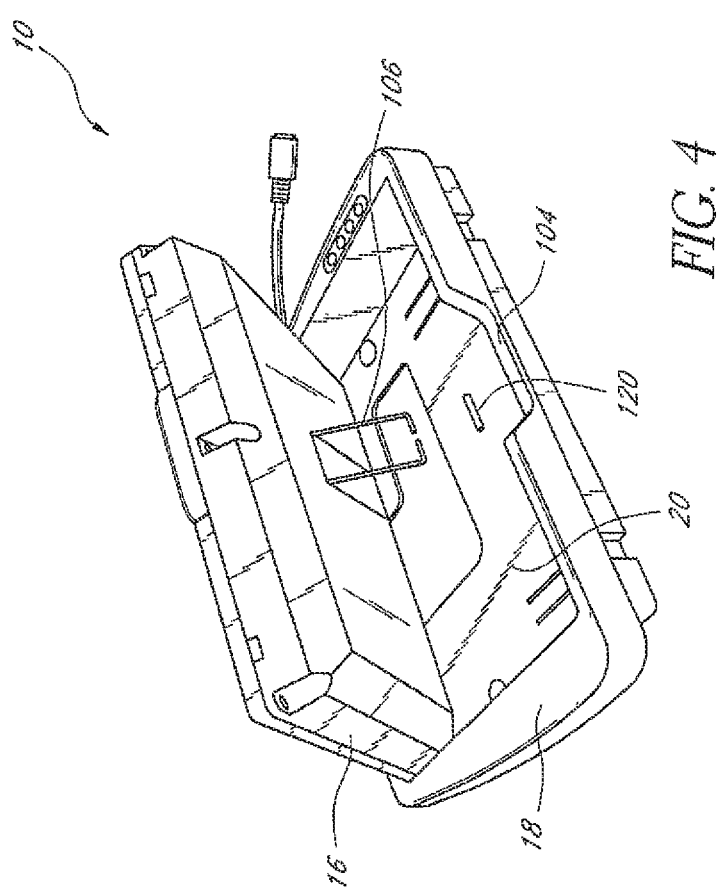
FIG. 4 is a perspective view of the headrest-mounted monitor of FIG. 1, illustrating the screen structure pivoted outward from the housing.

As shown in FIGS. 4, 5A and 5B, the monitor 10 includes a screen structure 16 that is pivotably attached to a housing 18. Both the housing 18 and an outer casing of the screen structure 16 are preferably constructed of a high-strength plastic, so that the monitor 18 is lightweight and durable. The housing 18, which is embedded in the headrest 12 as shown in FIGS. 1, 7A and 7B, includes a cavity 20 (FIGS. 3, 4 and 5B) defining a storage space for the screen structure 16. The cavity 20 is substantially the same size and shape as the screen structure 16, such that when the screen structure 16 is in the storage position of FIGS. 5A and 7A, a front face 22 of the screen structure 16 is substantially flush with an outer surface 24 of the housing 18, which is in turn substantially flush with a surface 25 of the headrest 12 (FIG. 7A). The monitor 10 thus preferably protrudes only minimally or not at all from the headrest 12.

In the illustrated embodiment, the screen structure 16 includes a front portion 26 (FIGS. 2A and 2B) that is a substantially rectangular parallelepiped, and a rear portion 28 that tapers inward from the front portion 26 toward a rear face 30. Each of the left and right faces 32, 34 of the screen structure 16 includes a first hinge portion 36 adjacent a top face 38 of the screen structure 16. Each hinge portion 36 comprises a substantially flat bar 40 defining a plane that is parallel to a side face 32,34 of the screen structure 16. The bar 40 is pivotably secured at a first end 42 to the side face 32, 34 of the screen structure 16, such that the bar 40 is pivotable in the plane defined by the bar 40. The first hinge portions 36 cooperate with second hinge portions 44 (FIGS. 3A-3C) on the housing 18 to pivotably secure the screen structure 16 to the housing 18, as described in detail below. The illustrated first hinge portions 36 are preferred, because they simplify the assembly of the monitor 10, as explained below. However, those of skill in the art will appreciate that a variety of alternate hinge constructions could be used and still achieve a number of advantages of the present monitor 10.

Figure 1A:
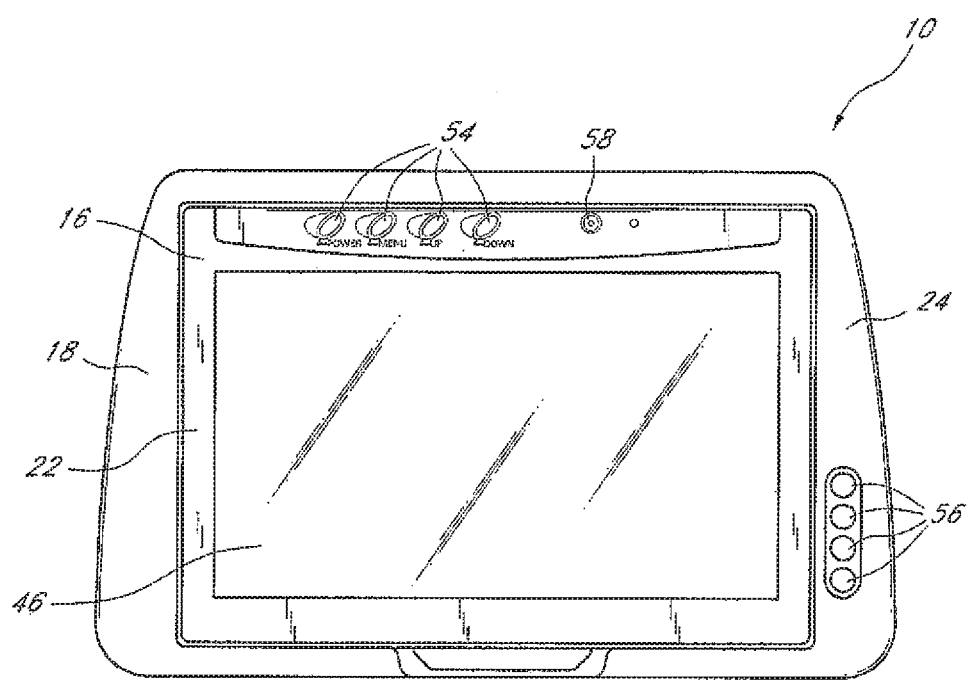
FIG. 1A is a front elevation view of the headrest-mounted monitor of FIG. 1.
Figure 2A:
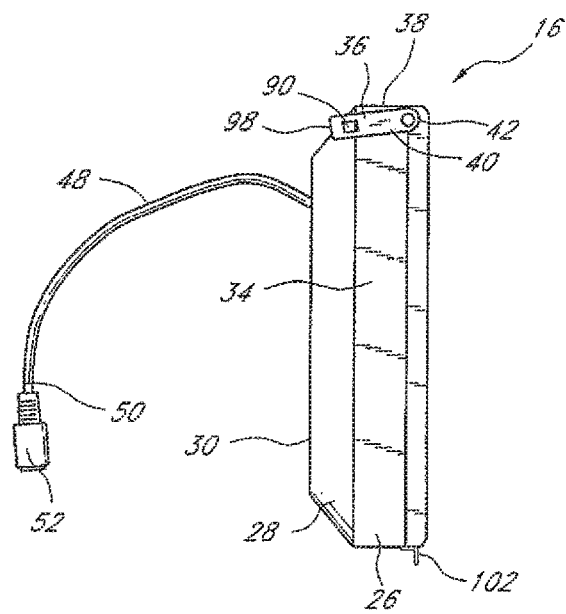
FIG. 2A is a left side elevation view of the screen structure of the headrest-mounted monitor of FIG. 1.
Figure 2B:
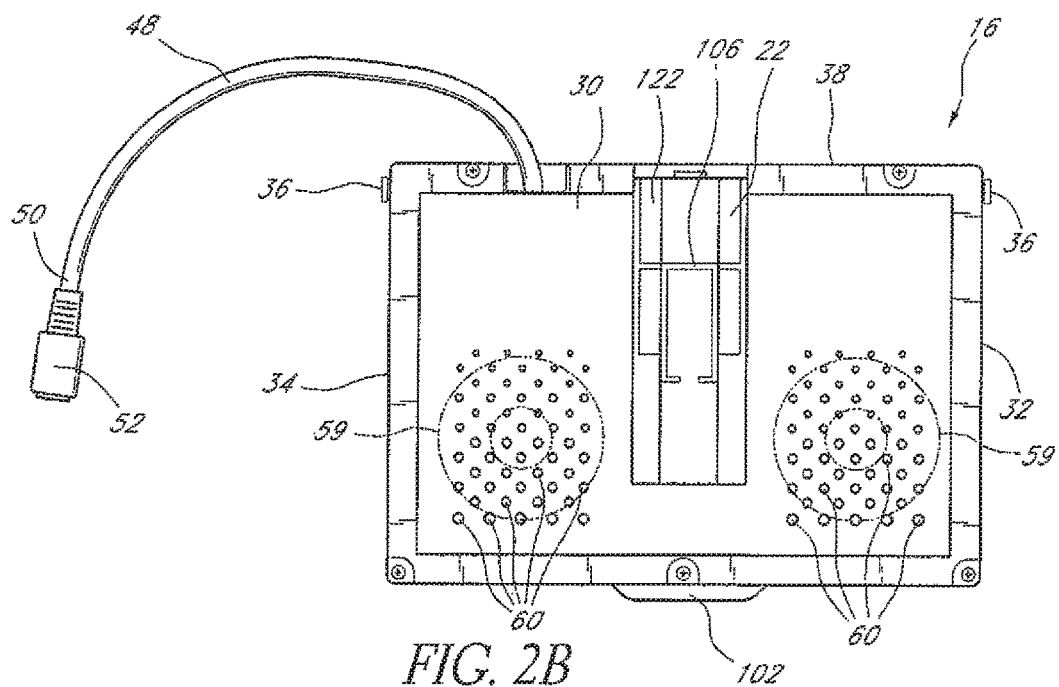
FIG. 2B is a rear elevation view of the screen structure of FIG. 2A.

The front surface 22 of the screen structure 16 (FIG. 1A) includes a viewing screen 46 that displays images to passengers. As shown in FIGS. 2A and 2B, the screen structure 16 includes an input cable 48 for receiving an input signal to control the images displayed on the viewing screen 46. A first end 50 of the cable preferably includes a multi-pin connector 52 that enables a variety of input devices to selectively communicate with the monitor 10.

The monitor 10 further includes a plurality of controls for determining characteristics of the displayed images. For example, one control preferably enables power to be selectively applied to the monitor 10. Other controls preferably enable a viewer to select between various input sources for the monitor 10, such as a television tuner, a DVD player, a video game system, etc. Other controls preferably enable adjustment of qualities of the screen images, such as brightness, sharpness, contrast, etc.

In the illustrated embodiment, a first cluster of manual controls 54 is located on the front face 22 of the screen structure 16, and a second cluster of manual controls 56 is located on the outer surface 24 of the housing 18 adjacent the screen structure 16. The front face 22 of the screen structure 16 further includes an infrared sensor 58 for receiving signals from a handheld wireless remote control unit (not shown). Those of skill in the art will appreciate that all controls may be located on the screen structure 16, or all controls may be located on the housing 18. Alternatively, the monitor 10 may include no integrated manual controls, such that the monitor 10 is controllable using only a handheld wired or wireless remote control unit.

An interior of the screen structure 16 preferably includes at least one speaker 59 that produces audible sounds that accompany the images displayed on the screen 46. At least one of the controls 54, 56 on the monitor 10 or on an optional remote control unit preferably enables adjustment of a volume level produced by the at least one speaker 59. The rear face 30 of the screen structure 16, shown in FIG. 2B, includes apertures 60 that enable sounds produced by the speaker 59 to be heard clearly by passengers. Those of skill in the art will appreciate that the apertures 60 are not necessary to achieve many advantages of the present monitor 10.

Those of skill in the art will also appreciate that the monitor 10 need not include a speaker 59. The monitor 10 could, for example, be connected to the vehicle's sound system such that sounds from the monitor 10 are produced by speakers mounted in the vehicle's interior. However, front seat passengers, who are not in a position to view the images on the monitor 10, may wish to listen to, for example, a radio broadcast through the vehicle's sound system. Therefore, providing at least one speaker 59 in the monitor 10 enables rear seat passengers to listen to sounds produced by the monitor 10, and front seat passengers to listen to sounds produced by the vehicle's sound system. To eliminate any dissonance created by two sources of different sounds, the monitor 10 could also include a headphone jack so that only backseat passengers wearing headphones can hear sounds produced by the monitor 10.

As shown in FIGS. 3A-3C, 5A and 5B, front edges of the housing 18 extend outward and backward, thus creating a rim 62 around the cavity 20 having a front face 64 and side faces 66, 68, 70, 72 that are substantially parallel to side faces of the cavity 20. The rim 62 increases the rigidity of the housing 18 without substantially increasing its weight or volume. In the illustrated embodiment, a portion of the front face 64 of the rim 62 adjacent a lower right edge 68 of the housing 18 includes a plurality of apertures 74. The apertures 74 are adapted to house controls, such as buttons or knobs, for adjusting various aspects of the monitor 10, as described above. Those of skill in the art will appreciate that the apertures 74 are not necessary to achieve all the advantages of the monitor 10, since controls may be mounted on the screen structure 16 or on a remote control unit.

A floor 76 of the cavity 20 preferably includes a plurality of apertures 78 (FIG. 3A) that cooperate with mounting hardware, such as screws 79 (FIG. 3A), to secure the housing 18 to the headrest 12. The floor 76 preferably also includes an aperture 80 of sufficient size to allow the input cable 48 to pass through the floor 76 without interference. A top surface 82, bottom surface 84 and opposing side surfaces 86 extend upward from the floor 76. The floor 76 protects the monitor 10 and the headrest 12 during use.

Adjacent the top surface 82, each side surface 86 of the cavity 20 includes a second hinge portion 44 (FIGS. 3A-3C) that cooperates with one of the first hinge portions 36 on the screen structure 16 to pivotably secure the screen structure 16 to the housing 18. Each second hinge portion 44 comprises a slot having a width substantially equal to a thickness of the bar 40 of the first hinge portion 36. The bar 40 is thus slidable within the slot. With the bar 40 disposed within the slot, a position and orientation of the bar 40 is fixed relative to the housing 18. However, because the bar 40 is rotatable with respect to the screen structure 16, the screen structure 16 is pivotable with respect to the housing 18.

A tab 88 within the slot cooperates with an aperture 90 (FIG. 2A) on the bar 40 to lock the bar 40 within the slot. The tab 88 is cantilevered and attached to a side edge 92 of the floor 76 of the cavity 20. The tab 88 includes a forward facing tapered portion 94 (FIG. 3C) that terminates in a ledge 96 that is perpendicular to a longitudinal axis of the tab 88 and faces away from the rim 62. As the bar 40 is inserted within the slot, the bar 40 slides along the outside of the tab 88, and the bar 40 urges the tab 88 inward due to interengagement of the bar 40 with the tapered surface 94. As a leading edge 98 (FIG. 2A) of the bar 40 reaches a rear end of the slot, the tab 88 snaps into position within the aperture 90 of the bar 40. The ledge 96 abuts an edge of the aperture 90, thus locking the bar 40 within the slot and securing the screen structure 16 to the housing 18. The present monitor 10 is thus easy to assemble. The bars 40 are simply inserted into the slots until the tabs 88 lock into place within the apertures 90.

While the illustrated second hinge portions 44 are preferred for their ease of assembly together with the illustrated first hinge portions 36, those of skill in the art will appreciate that the illustrated second hinge portions 44 are merely exemplary. A variety of alternate hinge constructions could be used to achieve many advantages of the present monitor 10.

Preferably, the first and second hinge portions 36, 44 are located near an upper edge 38, 82 of the screen structure 16 and housing 18, respectively. The upper edge 38 of the screen structure 16 thus remains substantially fixed with respect to the housing 18, while a lower edge 100 of the screen structure 16 is capable of protruding substantially from the front face 24 of the housing 18, as shown in FIG. 5B. Preferably, a finger catch 102 (FIGS. 2A, 2B, 5A and 5B) extends downward from the lower edge 100 of the screen structure 16. The finger catch 102 provides a convenient surface against which a viewer may place his or her fingers to rotate the screen structure 16 with respect to the housing 18. Preferably, the lower edge 70 of the housing 18 includes a cut out portion 104 (FIGS. 3A and 4) so that a viewer can reach behind the finger catch 102 to pull the screen structure 16 outward from the stowed position of FIG. 5A.

Advantageously, as the screen structure 16 pivots from the stowed position of FIG. 5A to the position of FIG. 5B, no portion of the rear face 30 of the screen structure 16 moves toward the floor 76 of the cavity 20. The floor 76 thus defines a limit for the monitor 10. No portion of the monitor 10, including the screen structure 16, extends beyond the floor 76 into the headrest 12. Thus, the overall monitor 10 occupies relatively little depth of the headrest 12, because the depth occupied by the monitor 10 corresponds roughly to the thickness of the screen structure 16.

With prior art monitors, such as the monitors disclosed in U.S. Pat. No. 5,267,775 to Nguyen, U.S. Pat. No. 5,507,556 to Dixon, and U.S. Pat. No. 5,842,715 to Jones, additional depth beyond the thickness of the screen structure would be required within a headrest to accommodate these monitors. As the screen structures of these monitors pivot from the stowed position to a viewing position, an upper edge of the screen structure would move backward into the headrest. This configuration is disadvantageous because limited space is available within a headrest.

The function of a headrest is to provide padding for comfort and safety. Thus, a headrest must comprise at least a minimum amount of padding. When a monitor is added to a headrest, padding is displaced. The padding may be eliminated entirely, but such elimination makes the headrest less comfortable and less safe. Alternatively, the padding may be retained but moved elsewhere within the headrest. Disadvantageously, this option makes the headrest larger. If the headrest is made wider, the extra width obstructs a larger portion of the driver's view. If instead the headrest is made deeper, (extends farther into rear passenger area) the portion of the headrest that protrudes into the rear passenger area presents an obstacle to rear seat passengers. Therefore, a headrest-mounted monitor desirably occupies minimal space.

Besides defining a thickness of the present monitor 10, the housing 18 also provides a self-contained casing for the monitor 10. The housing 18 thus protects the monitor 10 from impacts, for example. The housing 18 also facilitates installation and removal of the monitor 10. To exchange one monitor 10 for another, for example if the first monitor 10 is defective, the housing 18 and all of the components within the housing are easily removed from the headrest 12. A new monitor 10 is then easily installed by inserting the housing 18 of the new monitor 10 into the headrest 12.

As will be readily recognized by persons of ordinary skill in the art from the disclosure herein, one method of replacing a mobile entertainment system comprises providing a headrest 12 having a first monitor 10 mounted therein, the first monitor 10 comprising: a first housing 18 including a hinge portion 44, the first housing 18 having a first floor 76 defining one or more apertures 78 which cooperate with mounting hardware 79 to secure the first housing 18 to the headrest 12, the first housing 18 having a top wall 82, a bottom wall 84, and two side walls 86 which cooperate to define a first storage cavity 20; and a first screen structure 16 including a hinge portion 36, the hinge portions 44, 36 cooperating to pivotably secure the first screen structure 16 to the first housing 18. The method comprises rotating the first screen structure 16 outward from the first housing 18 to provide access to the first floor 76, removing the mounting hardware 79 from the first floor 76, and removing the first monitor 10 from the headrest 12. The method further comprises providing a second monitor 10 comprising: a second housing 18 including a hinge portion 44, the second housing 18 having a second floor 76 defining one or more apertures 78, the second housing 18 having a top wall 82, a bottom wall 84, and two side walls 86 which cooperate to define a second storage cavity 20; and a second screen structure 16 including a hinge portion 36, the hinge portions 44, 36 cooperating to pivotably secure the second screen structure 16 to the second housing 18. The method further comprises inserting the second monitor 10 into the headrest 12.

As shown in FIGS. 4, 5A and 5B, the monitor 10 preferably includes a bracket 106 that limits a range of pivot of the screen structure 16 relative to the housing 18. Advantageously, the bracket 106 facilitates securing the screen structure 16 in a desired viewing position. The bracket 106 also enhances the safety characteristics of the monitor 10, as explained below. However, those of skill in the art will appreciate that the monitor 10 need not include the bracket 106. Without the bracket 106, the screen structure 16 is pivotable approximately 90 degrees relative to the housing IS. The screen structure 16 can thus be pivoted to the optimum viewing angle.

The shape of the bracket 106, illustrated in FIG. 6, preferably resembles a straight wire 108 with an attached pair of L-shaped wires 110. Of course, the bracket 106 may be produced by many different processes such that the straight wire 108 and L-shaped wires 110 comprise one piece, or separate pieces attached to one another.

All three wires 108, 110, 110 are coplanar, and both L-shaped wires 110 extend from the straight wire 108 in the same direction. The upright portion 112 of each L-shaped wire 110 is substantially perpendicular to the straight wire 108, and the base portion 114 of each L-shaped wire 110 is substantially parallel to the straight wire 108. Further, the base portions 114 of each L-shaped wire 110 extend toward each other, and include a small gap 116 between their ends. The upright portions 112 of the L-shaped wires 110 are attached to the straight wire 108 such that opposite end portions of the straight wire 108, comprising posts 118, extend beyond the attachment points of the L-shaped wires 110.

The base portions 114 of the L-shaped wires 110, which define a first end 124 of the bracket 106, are pivotably retained within a tube 120 (FIGS. 3A, 4 and 5A-5B) on the floor 76 of the cavity 20. The tube 120 defines a first pivot opening and a second pivot opening. The posts 118 of the straight wire 108, which define a second end 126 of the bracket 106, are slidably retained within a channel 122 on the rear face 30 of the screen structure 16, as shown in FIGS. 2B, 5A and 5B. In the stowed position shown in FIG. 5A, the bracket 106 is substantially parallel to the rear face 30 of the screen structure 16. As the screen structure 16 pivots outward from the cavity 20, the base portions 114 of the L-shaped wires 110 pivot within the tube 120 and the posts 118 slide downward within the channel 122.

Preferably, the hinges 36, 44 that pivotably connect the screen structure 16 to the housing 18 are self-tensioning. Thus, the hinges 36, 44 retain the screen structure 16 in the position of FIG. 5B, and in any position in between the positions of FIG. 5A and FIG. 5B. A viewer can thus position the screen structure 16 anywhere between the limits of rotation to enjoy the optimum viewing angle. For example, the optimum viewing angle often depends upon the position of the sun. Glare from sunlight interferes with the viewer's ability to see images on the screen. Thus, the viewer can orient the screen structure 16 such that glare from sunlight is minimized. Furthermore, as the vehicle travels, its position and orientation with respect to the sun are continuously changing. At one moment, there may be little or no glare on the screen 46, and the next moment the vehicle may round a corner and suddenly there is a substantial glare on the screen 46. Because the present monitor 10 is positionable in a wide range of viewing angles, the monitor 10 enables the viewer to continuously adjust the angle of the screen structure 16 to avoid sun glare occasioned by variations in the vehicle's position and/or orientation with respect to the sun.

The present monitor 10 advantageously collapses toward the storage position (FIGS. 5A and 7A) when a force F is applied to the front surface 22 of the screen structure 16 as shown in FIGS. 5B and 7B. This feature is especially advantageous when a vehicle in which the monitor 10 is installed collides with another vehicle or brakes suddenly, for example. In these situations, a passenger seated behind the monitor 10 is often thrown forward, and may collide with the monitor 10. If the monitor 10 does not quickly collapse upon contact, the monitor 10 could injure the passenger.

As shown in FIG. 5B, the bracket 106 limits the rotation of the screen structure 16 relative to the housing 18. The length of the bracket 106 is fixed, and the first end 124 of the bracket 106 is constrained against translation. Therefore, a maximum angle that the screen structure 16 can be rotated from the stowed position of FIG. 5A coincides with a configuration wherein a longitudinal axis of the bracket 106 is perpendicular to the rear face 30 of the screen structure 16. In such a configuration, a force applied perpendicularly to the front face of the screen structure 16, such as the force F in FIG. 5B, would not have a component that acts on the bracket second end 126 in a direction parallel to the channel 122 and perpendicular to the bracket 106. Instead, the entire magnitude of the force would act in a direction parallel to the bracket 106, and would not cause the bracket second end 126 to slide upward within the channel 122, thus rotating the bracket 106 about its first end. In such a configuration, the bracket 106 would prevent the screen structure 16 from rotating back toward the storage configuration of FIG. 5A. The screen structure 16 would thus pose a danger to a passenger colliding with it, as in a crash or a sudden stop.

However, as explained above and illustrated in FIG. 5B, a lower end of the channel 122 in the rear face 30 of the screen structure 16 limits the travel of the bracket 106 within the channel 122 and prevents the bracket 106 from reaching the configuration wherein the bracket 106 is perpendicular to the rear face 30 of the screen structure 16. As shown in FIG. 5B, the maximum angle a between the bracket 106 and the rear face 30 of the screen structure 16 is preferably about 80 degrees, and more preferably about 75 degrees. In this configuration, the force F applied perpendicularly to the front face 22 of the screen structure 16 has a component that acts parallel to the channel 122, and a component that acts perpendicularly to the bracket 106. These force components cause the bracket second end 126 to translate upward within the channel 122, causing the bracket 106 to rotate about its first end 124 as the screen structure 16 collapses toward the storage configuration of FIG. 5A. The bracket 106 thus diminishes the injury-causing potential of the monitor 10 by enabling the screen structure 16 to pivot safely out of the way when a passenger collides with it.

Figure 8:
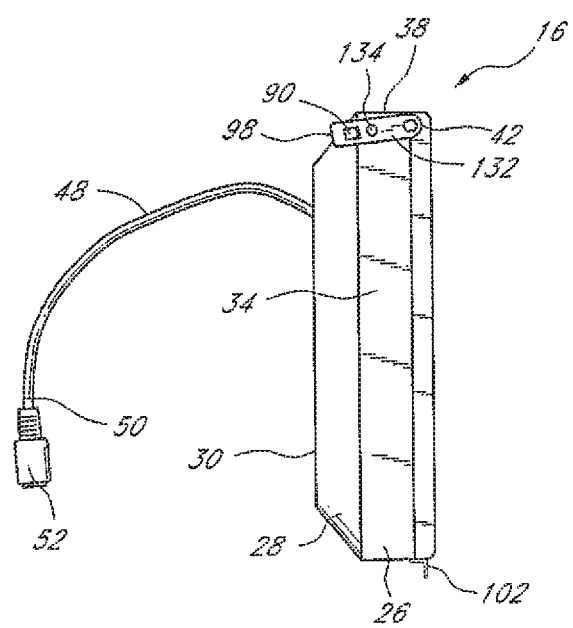
FIG. 8 is a left side elevation view of another preferred embodiment of the screen structure of the headrest-mounted monitor of FIG. 1.

FIG. 8 illustrates another preferred embodiment of the screen structure 128. FIGS. 9-11 illustrate another preferred embodiment of the housing 130, which is adapted to receive the screen structure 128 of FIG. 8. FIGS. 12 and 13 illustrate the housing 130 and screen structure 128 secured within a headrest 12. The illustrated screen structure 128 and housing 130 do not include a bracket 106. Thus, as shown in FIG. 13, the screen structure 128 is pivotable 90 degrees with respect to the housing. A viewer can thus adjust the viewing angle of the screen structure 128 to the optimum position. However, those of skill in the art will appreciate that the bracket 106 could be provided with the screen structure 128 and housing 130 in order to limit the pivotability of the screen structure 128 with respect to the housing 130.

The screen structure 128 is substantially similar to the screen structure 16 described above. The first hinge portion 132 of the screen structure is mounted on, and pivotable about, a post imbedded in the screen structure 128. Because the post is a separate component from the rest of the screen structure 128, the post is very easily constructed of a different material than the screen structure 128. The screen structure 128 is preferably constructed of plastic to make it lightweight and less expensive to manufacture. However, the post, which is part of the hinged connection holding the screen structure 128 to the housing 130, is preferably made from a high strength material, such as a metal. Like the first hinge portion 36 on the screen structure 16 described above, both the first hinge portion 132 and the post are preferably constructed of a high-strength material, such as a metal.

The first hinge portion 132 (FIG. 8) of the screen structure 128 includes an aperture 134 near a center thereof, as measured along a long axis of the first hinge portion 132. The aperture 134 is adapted to receive a fastening member to secure the screen structure 128 to the housing 130, as described below.

The housing 130 is substantially similar to the housing 18 described above. However, the second hinge portion 136 of the housing 130 does not include the tab 88 in the second hinge portion 44 of the housing 18. A side wall portion 138 (FIG. 11) of the second hinge portion 136 includes a substantially If-shaped aperture 140 that is adapted to receive a fastening member. Those of skill in the art will appreciate that the aperture 140 in the side wall portion 138 could have any of a variety of shapes.

The first hinge portion 132 on the screen structure 128 is slidable within the slot 142 (FIG. 9) formed by the second hinge portion 136 on the housing 130. When assembling the monitor 10, the first hinge portion 132 is slid into the second hinge portion 136 until the aperture 134 on the first hinge portion 132 aligns with the aperture 140 on the second hinge portion 136. A fastening member 144 (FIGS. 12 and 13), such as a screw, is inserted through the aperture 140 in the side wall portion 138 of the second hinge portion 136, and through the aperture 134 in the first hinge portion 132. The fastening member 144 thus secures the first and second hinge portions 132, 136 to one another, which secures the screen structure 128 to the housing 130. Advantageously, the slot 142 facilitates the proper positioning of the first hinge portion, particularly during the tightening of the fastening member 144.

The sturdy construction of the hinged connection between the screen structure 128 and the housing 130 reduces the risk of the screen structure 128 becoming detached from the housing 130 during a collision. The post that is imbedded in the screen structure 128 is preferably metal. Thus, the connection between the post and the screen structure 128 is very strong. The first hinge portion 132 is also preferably metal. Thus, the connection between the first hinge portion 132 and the post is also very strong.

The fastening member is preferably a metal screw, and the second hinge portion 136 is preferably a strong plastic. The interconnection of each of these high-strength materials greatly reduces the likelihood of the hinged connection breaking. Even in a high speed vehicle collision, the screen structure 128 is likely to remain firmly connected to the housing 130. By preventing the screen structure 128 from becoming detached during a crash, and subsequently drifting throughout the passenger compartment, the sturdy hinged connection of the monitor 10 decreases the likelihood of injury to the vehicle's passengers that might otherwise be caused by a flying screen structure 128.

Scope of the Invention

The above presents a description of the best mode contemplated for the present headrest-mounted monitor, and of the manner and process of making and using it, in such full, clear, concise, and exact terms as to enable any person skilled in the art to which it pertains to make and use this headrest-mounted monitor. This headrest-mounted monitor is, however, susceptible to modifications and alternate constructions from that discussed above which are fully equivalent. Consequently, it is not the intention to limit this headrest-mounted monitor to the particular embodiments disclosed. On the contrary, the intention is to cover all modifications and alternate constructions coming within the spirit and scope of the headrest-mounted monitor as generally expressed by the following claims, which particularly point out and distinctly claim the subject matter of the headrest-mounted monitor.

I claim:

1. A monitor, comprising:
   a housing having a cavity that defines a storage space and having a first hinge portion, the first hinge portion comprising a slot;
   a screen structure substantially the same size and shape as the storage space, the screen structure having a front face and a back face, the screen structure configured to attach to the housing such that the screen structure can pivot between a first configuration and a second configuration, the screen structure having a second hinge portion, the second hinge portion comprising a planar structure which is slidable within the slot, the second hinge portion cooperating with the first hinge portion to pivotably secure the screen structure to the housing when the planar structure is disposed within the slot, the planar structure being pivotally secured at one end to the screen structure, the other end being slidably mounted within the slot; and
   at least one speaker within an interior of the screen structure.

2. The monitor of claim 1, wherein the at least one speaker comprises a first speaker and a second speaker.

3. The monitor of claim 2, wherein the first speaker is on a first side of the screen structure and the second speaker is on a second side of the screen structure opposite the first side.

4. The monitor of claim 1, wherein the planar structure includes a bar.

5. A video system, comprising:
   a housing that defines a cavity, the housing having a first hinge portion comprising a slot;
   a screen structure secured within the housing such that the screen structure can pivot from a first position to a second position, the screen structure having a second hinge portion, the second hinge portion comprising a planar structure which is slidable within the slot, the second hinge portion cooperating with the first hinge portion to pivotably secure the screen structure to the housing when the planar structure is disposed within the slot, the planar structure being pivotally secured at one end to the screen structure, the other end being slidably mounted within the slot; and
   at least one speaker within the screen structure, the speaker configured to emit sounds through a back face of the screen structure,
   wherein the screen structure is substantially the same size and shape as the cavity.

6. The video system of claim 5, wherein the screen structure further comprises a plurality of openings on the back face of the screen structure.

7. The video system of claim 6, wherein the plurality of openings are aligned with the at least one speaker and are configured to enable sound to pass through the back of the screen structure.

8. The video system of claim 5, wherein the at least one speaker comprises a first speaker and a second speaker.

9. The video system of claim 8, wherein the first speaker is on a first side of the screen structure and the second speaker is on a second side of the screen structure opposite the first side.

10. The video system of claim 5, wherein the planar structure includes a bar.

\* \* \* \* \*